US009905394B1

(12) United States Patent
Bhattiprolu et al.

(10) Patent No.: US 9,905,394 B1
(45) Date of Patent: Feb. 27, 2018

(54) METHOD FOR ANALYZING AN OBJECT AND A CHARGED PARTICLE BEAM DEVICE FOR CARRYING OUT THIS METHOD

(71) Applicant: Carl Zeiss Microscopy GmbH, Jena (DE)

(72) Inventors: Sreenivas Bhattiprolu, Dublin, CA (US); Lorenz Lechner, Dublin, CA (US)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/434,132

(22) Filed: Feb. 16, 2017

(51) Int. Cl.
| H01J 37/244 | (2006.01) |
| H01J 37/10 | (2006.01) |
| H01J 37/28 | (2006.01) |
| H01J 37/305 | (2006.01) |
| H01J 37/26 | (2006.01) |

(52) U.S. Cl.
CPC ............ H01J 37/244 (2013.01); H01J 37/10 (2013.01); H01J 37/265 (2013.01); H01J 37/28 (2013.01); H01J 37/3053 (2013.01)

(58) Field of Classification Search
CPC .......... H01J 37/10; H01J 37/244; H01J 37/26; H01J 37/265; H01J 37/28; H01J 37/305; H01J 37/3053; H01J 37/3056; G01N 23/04
See application file for complete search history.

(56) References Cited

U.S. PATENT DOCUMENTS

| 2011/0226948 A1* | 9/2011 | Tanaka | H01J 37/222 250/307 |
| 2014/0131575 A1* | 5/2014 | Uemoto | G01N 23/2208 250/307 |
| 2015/0214004 A1* | 7/2015 | Pavia | H01J 37/28 250/307 |

(Continued)

OTHER PUBLICATIONS

Julie Villanova, et al., " 3D phase mapping of solid oxide fuel cell YSZ/Ni cermet at the nanoscale by holographic X-ray nanotomography", Journal of Power Sources, vol. 243, pp. 841-849, 2013.

(Continued)

*Primary Examiner* — David E Smith
(74) *Attorney, Agent, or Firm* — Muirhead and Saturnelli, LLC

(57) ABSTRACT

The system described herein analyzes an object using a charged particle beam device, such as an electron beam device and/or an ion beam device. The charged particle beam device is used to generate high resolution 3D data sets by sequentially removing material from the object, exposing surfaces of the object and generating images of the surfaces. When removing material from the object, an opening having sides is generated. Lamellas are generated using the sides and material characteristics of those lamellas are identified. Moreover, filtered data is generated for each pixel of images of the sides of the opening. The method uses the information with respect to the identified material characteristics, the images of the sides and the filtered data of those images to obtain information on the material characteristics for each pixel of each surface generated when sequentially removing material from the object.

17 Claims, 16 Drawing Sheets

(56) References Cited

U.S. PATENT DOCUMENTS

| | | | |
|---|---|---|---|
| 2015/0253353 A1* | 9/2015 | Alvis | G01Q 30/02 850/9 |
| 2016/0061754 A1* | 3/2016 | Hill | G01N 23/2252 250/310 |
| 2016/0247662 A1* | 8/2016 | Fujii | H01J 37/222 |

OTHER PUBLICATIONS

Stuart I. Wright, et al., "3D Orientation Microscopy", Electron Backscatter Diffraction in a Combined FIB/SEM, G.I.T. Imaging & Microscopy, Apr. 2007, pp. 40-41.
Zeiss—Oxford Instruments Brochure, "The Use of 3D EBSD in the Characterisation of a CdTe Thin Film", Abingdon (UK) 2011.
H. J. Lemmens, et al., "FIB/SEM and Automated Mineralogy for Core and Cuttings Analysis", SPE Russian Oil and Gas Conference and Exhibition, Moscow (Russia), Oct. 26-28, 2010.
Bruker flyer, "ESPRIT QUBE", Advanced 3D analysis of EBSD/EDS data, Innovation with Integrity, Berlin (Germany), 2016.
Wikipedia, "Electron Backscatter Diffraction", https://en.wikipedia.org/w/index.php?title=Electron_backscatter_diffraction&oldid=738491917, Sep. 2016.

* cited by examiner

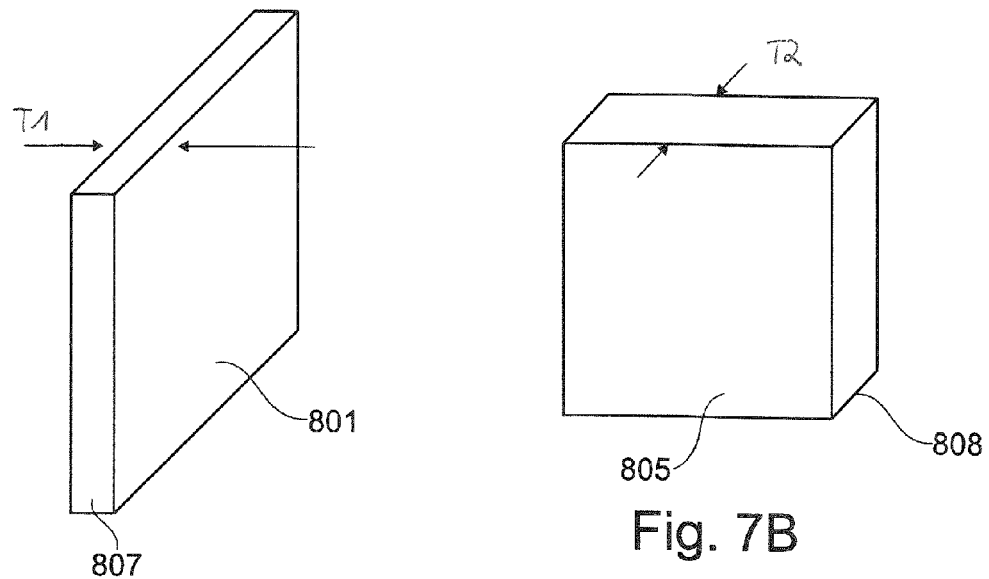
Fig. 7A
Fig. 7B
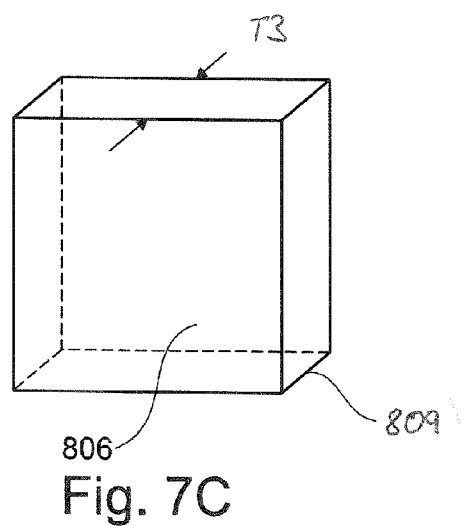
Fig. 7C

METHOD FOR ANALYZING AN OBJECT AND A CHARGED PARTICLE BEAM DEVICE FOR CARRYING OUT THIS METHOD

TECHNICAL FIELD

The system described herein relates to analyzing an object using a charged particle beam device generating a beam of charged particles and more particularly to an electron beam and/or an ion beam device that analyzes an object using a charged particle beam device generating a beam of charged particles.

BACKGROUND OF THE INVENTION

Charged particle beam devices are used for analyzing and examining objects (hereinafter also called samples) in order to obtain insights with regard to the properties and behavior of the objects under specific conditions. One of those charged particle beam devices is an electron beam device, in particular a scanning electron microscope (also known as SEM).

In an SEM, an electron beam (hereinafter also called primary electron beam) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes. Using a deflection unit, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An image of the sample to be analyzed is thus obtained.

The interaction radiation comprises X-rays and/or cathodoluminescence light and may be detected with a radiation detector. When measuring X-rays with the radiation detector, in particular energy-dispersive X-ray spectroscopy (also known as EDS or EDX) may be carried out. EDX is an analytical analysis method used for the elemental analysis or chemical characterization. Furthermore, when measuring X-rays with the radiation detector, in particular wavelength-dispersive X-ray spectroscopy (also known as WDS or WDX) may be carried out. WDX is also an analytical analysis method used for the elemental analysis or chemical characterization. EDX and WDX are often used as analytical analysis methods for analyzing rocks in the field of mineralogy. It is possible to identify the composition of a mineral grain, which is important information, in particular for a petrologist who needs to accurately determine the mineralogy of a rock.

An ion beam device is also known from the prior art. The ion beam device comprises an ion beam column having an ion beam generator. Ions are generated which are used for processing a sample (for example for removing a layer of the sample or for depositing material on the sample, wherein the material is provided by a gas injection system) or else for imaging.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column as mentioned above. The SEM serves, in particular, for observing the processing, but also for further analysis of the processed or non-processed sample. Electrons may also be used for depositing material. This is known as electron beam induced deposition (EBID). Ions may also be used for depositing material.

When analyzing an object with a charged particle beam device, further methods may be used for identifying characteristics of an object. Electron backscatter diffraction (also known as EBSD) is a technique used to analyze the crystallographic orientation and the crystal structure of materials. It is known to use EBSD in an SEM having an EBSD detector. The EBSD detector may comprise a CCD chip. The EBSD detector detects electrons backscattered from the object and generates detection signals. Based on the detection signals, an electron backscatter diffraction pattern (also known as EBSP) is generated. The EBSP comprises information about Kikuchi bands corresponding to lattice diffraction planes of an object to be analyzed.

A further technique for analyzing an object is known as transmission Kikuchi diffraction (also known as TKD). When using TKD, an electron beam is guided to an object which is thin enough to be transparent to a sufficient part of the electrons of the electron beam. In other words, electrons of the electron beam may transmit through the object. For example, the object is a foil. The object is positioned approximately horizontal with respect to the sample chamber. Alternatively, the object is slightly tilted away from the EBSD detector by an angle of up to 20° or up to 30°. The scattered and transmitted electrons of the electron beam emerging from a bottom side of the object are detected using the EBSD detector. The EBSD detector is positioned off-axis with respect to the optical axis of the electron beam guided to the object. In particular, the EBSD detector is positioned below the object and below a position which is normally used for EBSD when generating an EBSP as mentioned above. Using TKD, the EBSD detector generates detector signals used for acquiring and recording diffraction patterns of the object, the diffraction patterns being projected from the bottom side of the object to the EBSD detector.

EDX, WDX and EBSD are limited with respect to their analytical resolution by the sampling volume, wherein the resolution is about 1 µm, as explained further below. The landing energy of electrons of an SEM used for EDX, WDX and EBSD is often chosen in such a way that the electrons penetrate rather deep into the object and generate X-rays from a volume unit of the object comprising an extension of about 1 µm in a first direction, in a second direction and in a third direction. Therefore, the volume unit comprises dimensions of approximately 1 µm×1 µm×1 µm. However, this resolution may not be sufficient for analysis of materials, in particular in oil and gas applications since, for example, sedimentary rocks may comprise features of interest having a dimension much smaller than 1 µm.

A charged particle beam device such as a combination of an SEM with an ion beam column may be used to generate high resolution 3D data sets by sequentially removing material from the object, exposing a surface of the object and generating an image of the surface. The resolution of the image may be 1 nm to 3 nm. Unfortunately, as mentioned above, the analytical methods such as EDX, WDX and EBSD do not offer a resolution in nm-range, thus making it difficult to generate high resolution 3D analytical data sets obtained by EDX, WDX and EBSD.

It is desirable to provide a method for analyzing an object using a charged particle beam device and a charged particle beam device for carrying out the method which make it possible to obtain a high resolution 3D analytical data set based on analysis methods such as, for example, EDX, WDX and EBSD.

SUMMARY OF THE INVENTION

The system described herein analyzes an object using a charged particle beam device, for example an electron beam device and/or an ion beam device. The charged particle beam device may comprise a first charged particle beam generator for generating a first charged particle beam having first charged particles. The first charged particles may be electrons and/or ions. Moreover, the charged particle beam device may comprise a first objective lens for focusing the first charged particle beam onto the object. Additionally, the charged particle beam device may comprise a second charged particle beam generator for generating a second charged particle beam having second charged particles. The second charged particles may be electrons and/or ions. Moreover, the charged particle beam device may comprise a second objective lens for focusing the second charged particle beam onto the object. Moreover, the charged particle beam device may comprise a first detection unit for detecting interaction particles and a second detection unit for detecting interaction particles and/or interaction radiation, the interaction particles and the interaction radiation arising when the first charged particle beam and/or the second charged particle beam impinge(s) on the object.

The interaction particles may be secondary particles, for example secondary electrons or secondary ions, or backscattered particles, for example backscattered electrons. The interaction radiation may be X-rays or cathodoluminescence light.

The charged particle beam device may be used to generate high resolution 3D data sets by sequentially removing material from the object, exposing a surface of the object and generating an image of the surface. The resolution of the image may be 1 nm to 3 nm. More precisely, the method according to the system described herein may comprise the following steps:

guiding the first charged particle beam over the object and removing material from the object using the first charged particle beam. When removing the material from the object, a first surface of the object is exposed;

guiding the second charged particle beam over the first surface of the object, detecting interaction particles using the first detection unit, wherein the interaction particles arise when the second charged particle beam impinges on the first surface. A first detection signal is generated using the first detection unit and a first image of the first surface of the object is generated using the first detection signal. The first image comprises first image pixels, each pixel of the first image pixels comprising first image data;

guiding the first charged particle beam over the object and removing material—including said first surface—from the object using the first charged particle beam. When removing the material, a second surface of the object is exposed; and guiding the second charged particle beam over the second surface of the object. Interaction particles are detected using the first detection unit, the interaction particles arising when the second charged particle beam impinges on the second surface. A second detection signal is generated using the first detection unit. A second image of the second surface is generated using the second detection signal, the second image comprising second image pixels, each pixel of the second image pixels comprising second image data.

When removing the material from the object for exposing the first surface and the second surface of the object, an opening is generated in the object, in particular when the method steps mentioned above are sequentially repeated. The opening comprises a first side comprising the second surface and a second side extending from the second surface of the object in a direction away from the second surface.

The method according to the system described herein comprises a step of generating lamellas comprising the sides of the opening and of identifying the material characteristics of those lamellas. More precisely, the method according to the system described herein comprises the following steps:

generating a first lamella comprising the first side of the opening having the second surface as an outer surface. In other words, the first lamella comprising the first side is cut out of the object. The first charged particle beam and/or the second charged particle beam may be used for generating the first lamella;

generating a second lamella comprising at least a part of the second side of the opening. In other words, the second lamella comprising the second side is cut out of the object. The first charged particle beam and/or the second charged particle beam may be used for generating the second lamella;

guiding the second charged particle beam over the second side of the object, detecting interaction particles using the first detection unit, wherein the interaction particles arise when the second charged particle beam impinges on the second side of the object. Moreover, a third detection signal is generated using the first detection unit. Additionally, a third image of the second side of the object is generated using the third detection signal. The third image comprises third image pixels, each pixel of the third image pixels comprising third image data;

analyzing the first lamella by identifying first material characteristics of the first lamella associated to each pixel of the second image pixels using the first charged particle beam and/or the second charged particle beam and detecting interaction particles and/or interaction radiation using the second detection unit. In other words, the material characteristics of the object are identified for each particular pixel of the second image pixels. The material characteristics may comprise, for example, a material composition, a quantity of a specific element and/or a size of a specific element; and analyzing the second lamella by identifying second material characteristics of the second lamella associated to each pixel of the third image pixels using the first charged particle beam and/or the second charged particle beam and detecting interaction particles and/or interaction radiation using the second detection unit. In other words, the material characteristics of the object are identified for each particular pixel of the third image pixels. The material characteristics may comprise, for example, a material composition, a quantity of a specific element and/or a size of a specific element.

The first lamella and/or the second lamella may have a thickness in the range of 10 nm to 100 nm or in the range of 30 nm to 50 nm. However, the invention is not restricted to the aforementioned ranges. Rather, the thickness may have any value suitable for the system described herein.

The method according to the system described herein comprises the step of generating filtered data for each pixel of the second image pixels and the third image pixels. More precisely, the method according to the system described herein comprises the following steps:

generating first filtered data of each pixel of the second image pixels using at least one first image filter for processing the second image data for each pixel of the second image pixels; and generating second filtered data of each pixel of the third image pixels using at least one second image filter for processing the third image data for each pixel of the third image pixels.

In other words, each pixel of the second image pixels and/or each pixel of the third image pixels is/are filtered using the at least one first and one second image filters. Filtered data is generated associated to each pixel of the second image pixels and of the third image pixels. The at least one first image filter and/or the at least one second image filter may be a digital image filter, as explained further below. Optionally, the first image filter and the second image filter are identical.

The method according to the system described herein now uses the information with respect to the identified material characteristics and the filtered data to obtain information on the material characteristics for each pixel of each surface generated when sequentially removing material from the object. More precisely, the method according to the system described herein also comprises the following steps:

identifying data identical or similar to the first image data of each pixel of the first image pixels of the first image from among the following: the second image data of each pixel of the second image pixels, the third image data of each pixel of the third image pixels, the first filtered data for each pixel of the second image pixels and the second filtered data for each pixel of the third image pixels. The data is considered to be similar to the first image data of each pixel of the first image pixels of the first image if a calculation based on probability reveals that this data comes closest to the first image data of each pixel of the first image pixels; and assigning material characteristics to at least one pixel of the first image pixels of the first image, wherein:
(i) the first material characteristics are assigned if at least one of: the identified second image data of a pixel of the second image pixels and the identified first filtered data for a pixel of the second image pixels is identical or similar to the first image data of the at least one pixel of the first image pixels; and wherein
(ii) the second material characteristics are assigned if at least one of: the identified third image data of a pixel of the third image pixels and the identified second filtered data for a pixel of the third image pixels is identical or similar to the first image data of the at least one pixel of the first image pixels.

A further method according to the system described herein is used for analyzing an object using a charged particle beam device, for example an electron beam device and/or an ion beam device. The charged particle beam device may comprise a charged particle beam generator for generating a charged particle beam having charged particles.

The charged particles may be electrons and/or ions. Moreover, the charged particle beam device may comprise an objective lens for focusing the charged particle beam onto the object. Additionally, the charged particle beam device may comprise a gas injection unit for providing gas to the object. The gas may be a reactive gas such as, for example, $Cl_2$, $I_2$, $SiF_4$, $CF_4$, $NF_3$, $N_2O$, $NH_3+O_2$, $NO_2$, $H_2O$ or $XeF_2$. However, the invention is not restricted to the aforementioned examples. Any gas may be used which is suitable for carrying out the method of the system described herein. Moreover, the charged particle beam device may comprise a first detection unit for detecting interaction particles and a second detection unit for detecting interaction particles and/or interaction radiation, the interaction particles and the interaction radiation arising when the charged particle beam impinges on the object.

The interaction particles may be secondary particles, for example secondary electrons or secondary ions, or backscattered particles, for example backscattered electrons. The interaction radiation may be X-rays or cathodoluminescence light.

The charged particle beam device used for the further method according to the system described herein generates high resolution 3D data sets by sequentially removing material from the object, exposing a surface of the object and generating an image of the surface. The resolution of the image may be 1 nm to 3 nm. More precisely, the further method according to the invention may comprise the following steps:

guiding the charged particle beam over the object and removing material from the object using the charged particle beam and the gas provided by the gas injection unit. When removing the material from the object, a first surface of the object is exposed;

guiding the charged particle beam over the first surface of the object, detecting interaction particles using the first detection unit, wherein the interaction particles arise when the charged particle beam impinges on the first surface. A first detection signal is generated using the first detection unit and a first image of the first surface of the object is generated using the first detection signal. The first image comprises first image pixels, each pixel of the first image pixels comprising first image data;

guiding the charged particle beam over the object and removing material comprising the first surface from the object using the charged particle beam and the gas provided by the gas injection unit. When removing the material, a second surface of the object is exposed; and guiding the charged particle beam over the second surface of the object. Interaction particles are detected using the first detection unit, the interaction particles arising when the charged particle beam impinges on the second surface. A second detection signal is generated using the first detection unit. A second image of the second surface is generated using the second detection signal, the second image comprising second image pixels, each pixel of the second image pixels comprising second image data.

When removing the material from the object for exposing the first surface and the second surface of the object, an opening is generated in the object, in particular when the method steps mentioned above are sequentially repeated. The opening comprises a first side comprising the second surface and a second side extending from the second surface of the object in a direction away from the second surface.

The further method according to the system described herein comprises a step of generating lamellas comprising the sides of the opening and of identifying the material characteristics of those lamellas. More precisely, the method according to the system described herein comprises the following steps:

generating a first lamella comprising the first side of the opening having the second surface as an outer surface. In other words, the first lamella comprising the first side is cut out of the object. The charged particle beam and the gas provided by the gas injection unit may be used for generating the first lamella;

generating a second lamella comprising at least a part of the second side of the opening. In other words, the second lamella comprising the second side is cut out of the object. The charged particle beam and the gas provided by the gas injection unit may be used for generating the second lamella;

guiding the charged particle beam over the second side of the object, detecting interaction particles using the first detection unit, wherein the interaction particles arise when the charged particle beam impinges on the second side of the object. Moreover, a third detection signal is generated using the first detection unit. Additionally, a third image of the second side of the object is generated using the third detection signal. The third image comprises third image pixels, each pixel of the third image pixels comprising third image data;

analyzing the first lamella by identifying first material characteristics of the first lamella associated to each pixel of the second image pixels using the charged particle beam and detecting interaction particles and/or interaction radiation using the second detection unit. In other words, the material characteristics of the object are identified for each particular pixel of the second image pixels. The material characteristics may comprise, for example, a material composition, a quantity of a specific element and/or a size of a specific element; and analyzing the second lamella by identifying second material characteristics of the second lamella associated to each pixel of the third image pixels using the charged particle beam and detecting interaction particles and/or interaction radiation using the second detection unit. In other words, the material characteristics of the object are identified for each particular pixel of the third image pixels. The material characteristics may comprise, for example, a material composition, a quantity of a specific element and/or a size of a specific element.

The further method according to the system described herein comprises the step of generating filtered data for each pixel of the second image pixels and the third image pixels. More precisely, the method according to the system described herein comprises the following steps:

generating first filtered data of each pixel of the second image pixels using at least one first image filter for processing the second image data for each pixel of the second image pixels; and generating second filtered data of each pixel of the third image pixels using at least one second image filter for processing the third image data for each pixel of the third image pixels.

In other words, each pixel of the second image pixels and/or each pixel of the third image pixels are filtered using the at least one first and one second image filters. Filtered data is generated associated to each pixel of the second image pixels and of the third image pixels. The at least one first image filter and/or the at least one second image filter may be a digital image filter, as explained further below. Optionally, the first image filter and the second image filter are identical.

The further method according to the system described herein now uses the information with respect to the identified material characteristics and the filtered data to obtain information on the material characteristics for each pixel of each surface generated when sequentially removing material from the object. More precisely, the further method according to the system described herein also comprises the following steps:

identifying data identical or similar to the first image data of each pixel of the first image pixels of the first image from among the following: the second image data of each pixel of the second image pixels, the third image data of each pixel of the third image pixels, the first filtered data for each pixel of the second image pixels and the second filtered data for each pixel of the third image pixels. The data is considered to be similar to the first image data of each pixel of the first image pixels of the first image if a calculation based on probability reveals that this data comes closest to the first image data of each pixel of the first image pixels; and assigning material characteristics to at least one pixel of the first image pixels of the first image, wherein:
(i) the first material characteristics are assigned if at least one of: the identified second image data of a pixel of the second image pixels and the identified first filtered data for a pixel of the second image pixels is identical or similar to the first image data of the at least one pixel of the first image pixels; and wherein
(ii) the second material characteristics are assigned if at least one of: the identified third image data of a pixel of the third image pixels and the identified second filtered data for a pixel of the third image pixels is identical or similar to the first image data of the at least one pixel of the first image pixels.

The methods according to the system described herein provide for obtaining a high resolution 3D analytical data set based on analysis methods such as, for example, EDX, WDX, EBSD and TKD. In particular, each of the above mentioned methods combines the high resolution of an image obtained using a charged particle beam device such as an SEM and the data obtained when analyzing a lamella using analysis methods such as, for example, EDX, WDX, EBSD and TKD. The high resolution analytical capability is improved by generating the first lamella and the second lamella which may be as thin as a TEM lamella generated from a bulk object known from the prior art. In particular, analysis methods such as EDX and/or WDX may be used when analyzing the lamella to quantify and identify material characteristics such as, for example, the composition of the material of the lamella, in particular existing mineralogy and phases. Phases and crystal orientations may be determined by TKD and/or EBSD. Since the first lamella and the second lamella are thin, most particles of the charged particle beam used for the above mentioned analysis methods and impinging on the first lamella and on the second lamella transmit through the lamella. X-rays are generated in a rather small volume, such as 10 nm×10 nm×10 nm, in comparison to a bulk object used in the prior art, the bulk object having a volume of, for example, 1000 nm×1000 nm×1000 nm. Accordingly, the data sets generated when using the above mentioned analysis methods on the thin first lamella and thin second lamella provide a high resolution, for example 10 nm.

Moreover, each method according to the system described herein provides for a fast identification of material characteristics of surfaces of slices obtained by removing material from an object. The methods according to the system described herein generally do not provide for analysis of each exposed surface when removing material from the object. Instead, images of each exposed surface are generated, and sides of an opening are analyzed with respect to the material characteristics, using lamellas comprising the sides. The data obtained from analyzing the sides is used to identify the material characteristics of each exposed surface by calculation.

Any method which is suitable for identifying data which are identical or similar to the first image data for each pixel of the first image pixels of the first image may be used. A machine learning segmentation (wherein the segmentation is a classification) may be one of those methods. The machine learning segmentation may be a classifier. Therefore, the image data of each surface may be classified (that is identified and assigned to a specific material characteristic) using the machine learning segmentation. The machine learning segmentation provides proper classification of each pixel of the images of the obtained surfaces and properly identifies grain boundary and texture. As the classification—that means the segmentation—is performed on high resolution images, the obtained classified volume of a slice comprising a specific surface retains the high resolution of the images.

It is additionally or alternatively provided in an embodiment of each of the methods according to the system described herein that each method may further comprise a step of generating a further lamella comprising a side of the opening and of identifying the material characteristics of this lamella. More precisely, the method according to the system described herein may comprise the following steps:

generating a third lamella having a third side of the opening, the third side and the second side being arranged opposite to each other and the first side being arranged between the second side and the third side;

guiding the second charged particle beam (or the charged particle beam when using the further method) over the third side of the object, detecting interaction particles using the first detection unit, the interaction particles arising when the second charged particle beam (or the charged particle beam when using the further method) impinges on the third side of the object. Moreover, a fourth detection signal is generated using the first detection unit and a fourth image of the third side of the object is generated using the fourth detection signal. The fourth image comprises fourth image pixels, each pixel of the fourth image pixels comprising fourth image data;

analyzing the third lamella by identifying third material characteristics of the third lamella associated to each pixel of the fourth image pixels using the first charged particle beam, the second charged particle beam and the charged particle beam when using the further method, respectively, and detecting interaction particles and/or interaction radiation using the second detection unit; and generating third filtered data for each pixel of the fourth image pixels using at least one third image filter for processing the fourth image data for each pixel of the fourth image pixels.

Moreover, the step of identifying data identical or similar to the first image data for each pixel of the first image pixels of the first image also comprises identifying data from among the following: the fourth image data of each pixel of the fourth image pixels and the third filtered data for each pixel of the fourth image pixels. The step of assigning material characteristics to at least one pixel of the first image pixels of the first image also comprises assigning the third material characteristics if the identified fourth image data of a pixel of the fourth image pixels and/or the identified third filtered data for a pixel of the fourth image pixels is/are identical or similar to the first image data of the at least one pixel of the first image pixels.

It is additionally or alternatively provided in an embodiment of each of the methods according to the system described herein that the step of identifying identical or similar data comprises comparing the first image data for each pixel of the first image pixels of the first image to at least one of: the second image data of each pixel of the second image pixels, the third image data of each pixel of the third image pixels, the fourth image data of each pixel of the fourth image pixels, the first filtered data for each pixel of the second image pixels, the second filtered data for each pixel of the third image pixels and the third filtered data for each pixel of the fourth image pixels.

It is additionally or alternatively provided in an embodiment of each of the methods according to the system described herein that each method may comprise analyzing the first lamella, the second lamella and/or the third lamella using X-rays and/or cathodoluminescence light.

It is additionally or alternatively provided in a further embodiment of each of the methods according to the system described herein that each method may further comprise analyzing the first lamella, the second lamella and/or the third lamella using EDX, WDX, EBSD and/or TKD.

It is additionally or alternatively provided in an embodiment of each of the methods according to the system described herein that the step of identifying identical or similar data comprises using a learning method for classification. In particular, one of the following methods may be used: a random decision forest, association rule learning, an artificial neural network, a support vector machine and a Bayesian network. The aforementioned methods are machine learning methods for classification, wherein classification is the problem of identifying to which of a set of categories a new set of data belongs.

It is additionally or alternatively provided in an embodiment of each of the methods according to the system described herein that each method may further comprise using at least one of the following filters as the first image filter, the second image filter or the third image filter: a Gabor filter, a mean filter, a variance filter, a histogram oriented gradient filter, a maximum filter, a minimum filter and a Kuwahara filter. A Gabor filter is a band pass filter for texture analysis. A mean filter is a method of smoothing images thereby reducing the amount of intensity variation between two pixels. A variance filter, a maximum filter and a minimum filter are also known in the art. A Kuwahara filter is a nonlinear smoothing filter used in image processing for adaptive noise reduction.

The system described herein also refers to a computer program product comprising a program code which may be loaded or is loaded into a processor and which, when being executed, controls a charged particle beam device in such a way that a method comprising at least one of the steps mentioned above or further below or a combination of at least two of the steps mentioned above or further below is carried out.

The system described herein also refers to a charged particle beam device for analyzing an object. The charged particle beam device may comprise a first charged particle beam generator for generating a first charged particle beam having first charged particles. The first charged particles may be electrons and/or ions. The charged particle beam device may also have a first objective lens for focusing the first charged particle beam onto the object. Moreover, the charged particle beam device may comprise a second charged particle beam generator for generating a second charged particle beam having second charged particles. The second charged particles may be electrons and/or ions. A second objective lens for focusing the second charged particle beam onto the object is provided. Moreover, the charged particle beam device may comprise a first detection unit for detecting interaction particles and a second detection unit for detecting interaction particles and/or interaction radiation, the interaction particles and the interaction radiation arising when at least one of: (i) the first charged particle beam and (ii) the second charged particle beam impinges on the object. Moreover, the charged particle beam device may comprise at least one processor into which a computer program product as the one mentioned above is loaded.

The system described herein also refers to a further charged particle beam device for analyzing an object. The further charged particle beam device may comprise a charged particle generator for generating a charged particle beam having charged particles. The charged particles may be electrons and/or ions. The further charged particle beam device may also have an objective lens for focusing the charged particle beam onto the object. Moreover, the further charged particle beam device may comprise a gas injection unit for providing gas to the object. The gas may be a reactive gas such as, for example, $Cl_2$, $I_2$, $SiF_4$, $CF_4$, $NF_3$, $N_2O$, $NH_3+O_2$, $NO_2$, $H_2O$ or $XeF_2$. However, the invention is not restricted to the aforementioned examples. Any gas may be used which is suitable for carrying out the system described herein. Moreover, the further charged particle beam device may comprise a first detection unit for detecting interaction particles and a second detection unit for detecting interaction particles and/or interaction radiation, the interaction particles and the interaction radiation arising when the charged particle beam impinges on the object. Moreover, the further charged particle beam device may comprise at least one processor into which a computer program product as the one mentioned above is loaded.

In an embodiment of each of the above mentioned charged particle beam devices according to the system described herein, it is additionally or alternatively provided that a first detector comprises the first detector unit and a second detector comprises the second detector unit. Thus, the two detector units are arranged in different detectors. In an alternative embodiment a single detector comprises the first detector unit and the second detector unit.

In an embodiment of each of the above mentioned charged particle beam devices according to the system described herein, it is additionally or alternatively provided that each of the charged particle beam devices may be at least one of the following: an electron beam device and an ion beam device. In particular, the charged particle beam device may be both an electron beam device and an ion beam device.

BRIEF DESCRIPTION OF THE DRAWINGS

Embodiments of the invention described herein will be explained in more detail in the following text with reference to the figures, in which:

FIGS. 7A-7C are schematic representations of lamellas;

DETAILED DESCRIPTION OF VARIOUS EMBODIMENTS

Figure 1:
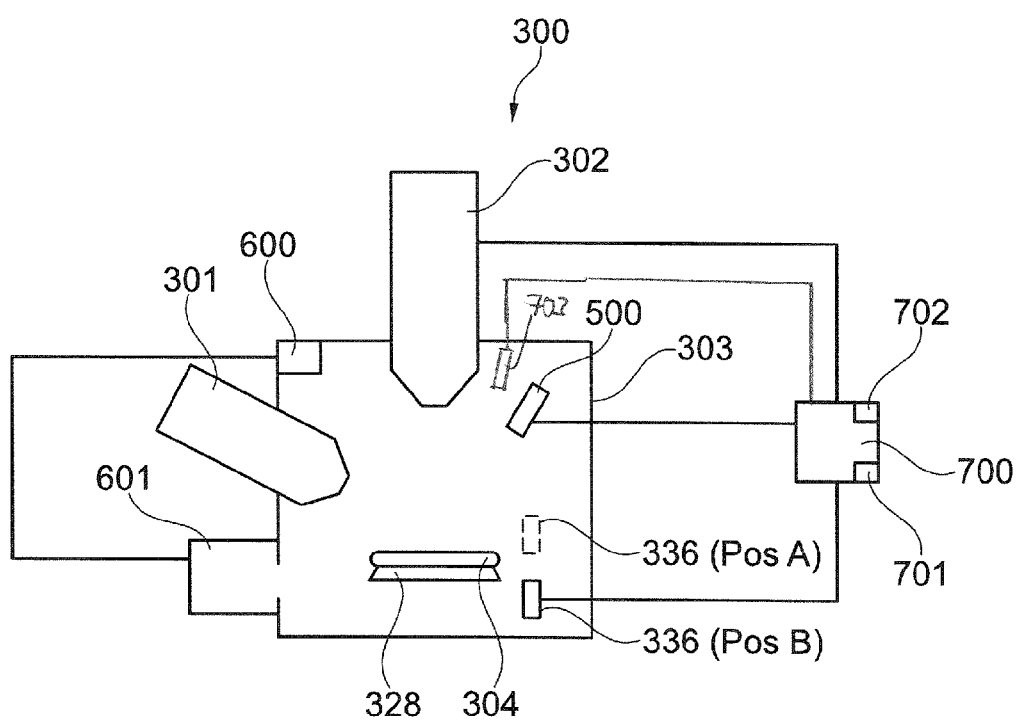
FIG. 1 shows a schematic representation of an embodiment of a charged particle beam device according to the system described herein.

FIG. 1 shows a schematic illustration of a first embodiment of a charged particle beam device 300 according to the invention. The charged particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

Figure 2:
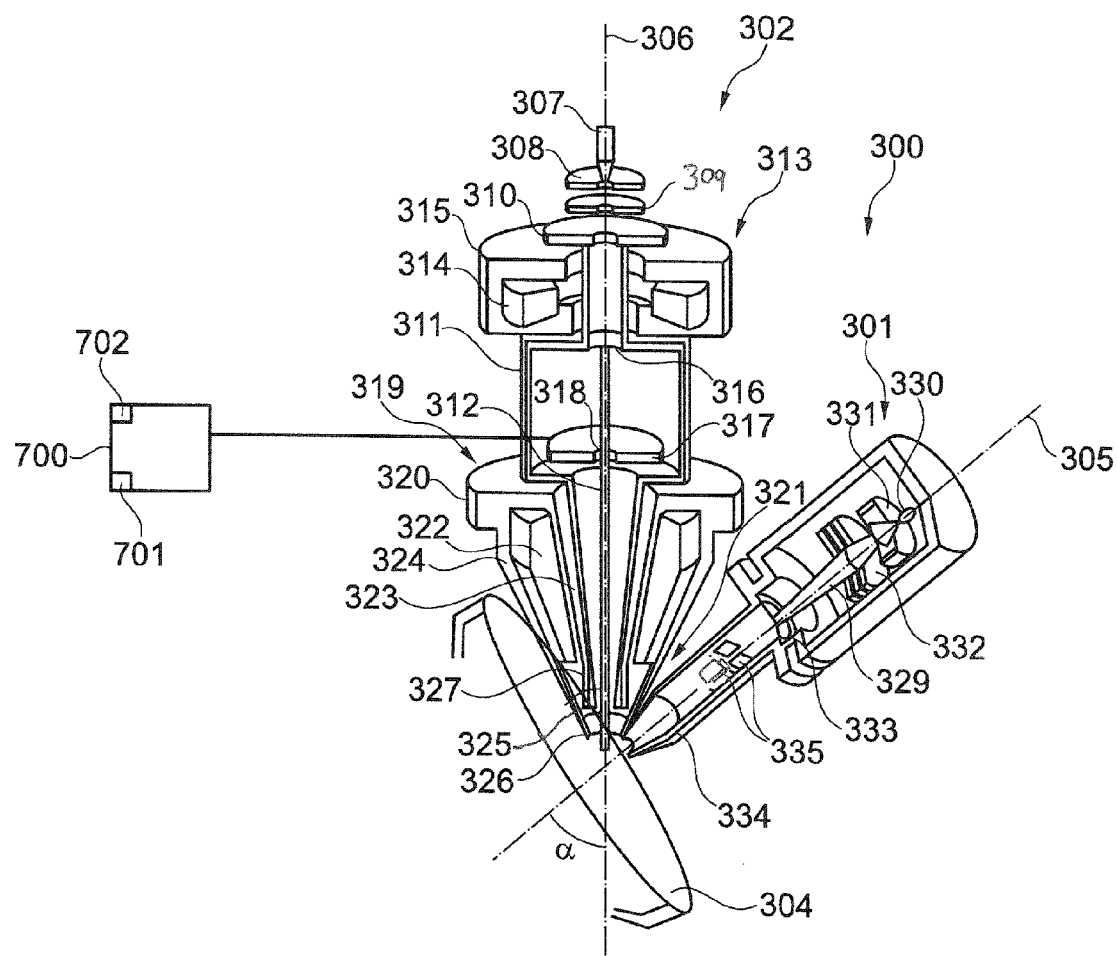
FIG. 2 shows a further schematic representation of the charged particle beam device according to FIG. 1.

FIG. 2 shows a detailed illustration of the charged particle beam device 300 shown in FIG. 1. For clarity reasons, the object chamber 303 is not illustrated. The first particle beam column 301 in the form of the ion beam column has a first optical axis 305. Furthermore, the second particle beam column 302 in the form of the electron beam column has a second optical axis 306.

The second particle beam column 302, in the form of the electron beam column, will be described next. The second particle beam column 302 has a second beam generator 307, a first electrode 308, a second electrode 309 and a third electrode 310. By way of example, the second beam generator 307 is a thermal field emitter. The first electrode 308 has the function of a suppressor electrode, while the second electrode 309 has the function of an extractor electrode. The third electrode 310 is an anode, and at the same time forms one end of a beam guide tube 311.

A second charged particle beam 312 in the form of an electron beam is generated by the second beam generator 307. Electrons which emerge from the second beam generator 307 are accelerated to the anode potential, for example in the range from 1 kV to 30 kV, as a result of a potential difference between the second beam generator 307 and the third electrode 310. The second charged particle beam 312 in the form of the electron beam passes through the beam guide tube 311, and is focused onto the object 304 to be analyzed and/or processed. This will be described in more detail further below.

The beam guide tube 311 passes through a collimator arrangement 313 which has a first annular coil 314 and a yoke 315. Seen in the direction of the object 304, from the second beam generator 307, the collimator arrangement 313 is followed by a pin hole diaphragm 316 and a detector 317 with a central opening 318 arranged along the second optical axis 306 in the beam guide tube 311. In a further embodiment, the opening 318 may be not centered.

The beam guide tube 311 then runs through a hole in a second objective lens 319. The second objective lens 319 is used for focusing the second charged particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 comprises an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second charged particle beam 312 to be decelerated to a desired energy which is required for examination of the object 304.

The second particle beam column 302 furthermore has a raster device 327, by which the second charged particle beam 312 can be deflected and can be scanned in the form of a raster over the object 304.

For imaging purposes, the detector 317, which is arranged in the beam guide tube 311, detects secondary electrons and/or backscattered electrons, which result from the interaction between the second charged particle beam 312 and the object 304. The signals generated by the detector 317 are transmitted to a control unit 700.

A further particle detector 703 is arranged in the object chamber 303 (see FIG. 1). The particle detector 703 detects secondary electrons and/or backscattered electrons, which result from the interaction between the second charged particle beam 312 and the object 304. The signals generated by the particle detector 703 are transmitted to the control unit 700.

A further detector, namely an EBSD detector 336, is arranged in the object chamber 303. The EBSD detector 336 is positioned off-axis with respect to the second optical axis 306 of the second particle beam column 302. The EBSD detector 336 may be positioned in a first position Pos A above the object 304. In a second position Pos B, the EBSD detector 336 is positioned below the object 304 (see FIG. 1).

Interaction radiation, for example X-rays or cathodoluminescence light, may be detected by using a radiation detector 500, for example a CCD-detector, which is arranged in the object chamber 303 (see FIG. 1). The radiation detector 500 is positioned at the side of the object 304 and is directed to the object 304.

The object 304 is arranged on an object holder 328 in the form of a sample stage as shown in FIG. 1, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second charged particle beam 312 or to a first charged particle beam 329. Alternatively, the surface of the object 304 may be oriented in such a way that the surface of the object 304 on one hand and the first charged particle beam 329 or the second charged particle beam 312 on the other hand are at an angle, for example in the range of 0° to 90°.

As mentioned previously, reference symbol 301 denotes the first particle beam column, in the form of the ion beam column. The first particle beam column 301 has a first beam generator 330 in the form of an ion source. The first beam generator 330 is used for generating the first charged particle beam 329 in the form of an ion beam. Furthermore, the first particle beam column 301 is provided with an extraction electrode 331 and a collimator 332. The collimator 332 is followed by a variable aperture 333 in the direction of the object 304 along the first optical axis 305. The first charged particle beam 329 is focused onto the object 304 by a first objective lens 334 in the form of a focusing lens. Raster electrodes 335 are provided in order to scan the first charged particle beam 329 over the object 304 in the form of a raster.

When the first charged particle beam 329 strikes the object 304, the first charged particle beam 329 interacts with the material of the object 304. In the process, interaction radiation is generated and detected using the radiation detector 500. Interaction particles are generated, in particular secondary electrons and/or secondary ions. These are detected using the detector 317.

The object chamber 303 is operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor 600 is arranged in the object chamber 303 for measuring the pressure in the object chamber 303 (see FIG. 1). A pump system 601 connected to the pressure sensor 600 and arranged at the object chamber 303 provides for the pressure range in the object chamber 303, either the first pressure range or the second pressure range.

The first charged particle beam 329 may also be used to process the object 304. For example, material may be deposited on the surface of the object 304 using the first charged particle beam 329, wherein the material is provided with a gas injection system (GIS). Additionally or alternatively, structures may be etched into the object 304 using the first charged particle beam 329. Moreover, the second charged particle beam 312 may be used to process the object 304, for example by electron beam induced deposition.

The detector 317, the EBSD detector 336, the radiation detector 500 and the particle detector 703 are connected to the control unit 700 as shown in FIGS. 1 and 2. The control unit 700 comprises a processor 701 into which a computer program product comprising a program code is loaded, which, when being executed, controls the charged particle beam device 300 in such a way that a method according to the invention is carried out. This will be explained further below. Moreover, the control unit 700 may comprise a database 702.

Figure 3:
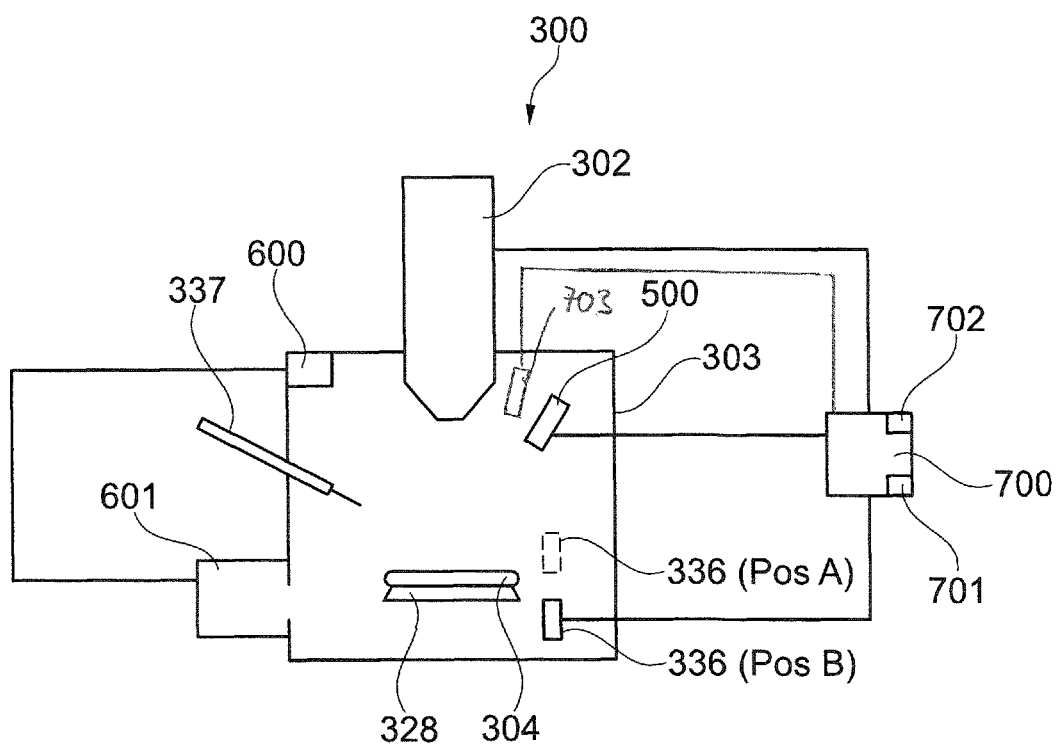
FIG. 3 shows a schematic representation of a further embodiment of a charged particle beam device according to the system described herein.

FIG. 3 shows a schematic illustration of a second embodiment of a charged particle beam device 300 according to the system described herein. The embodiment of FIG. 3 is based on the embodiment of FIGS. 1 and 2. Therefore, like reference signs denote like parts. However, the embodiment of FIG. 3 does not comprise the first particle beam column 301, but it comprises the second particle beam column 302. Moreover, the embodiment of FIG. 3 comprises a gas injection unit 337 providing gas to the object 304. The gas may be a reactive gas such as, for example, $Cl_2$, $I_2$, $SiF_4$, $CF_4$, $NF_3$, $N_2O$, $NH_3+O_2$, $NO_2$, $H_2O$ or $XeF_2$. However, the invention is not restricted to the aforementioned examples. Any gas may be used which is suitable for carrying out the system described herein.

Figure 4:
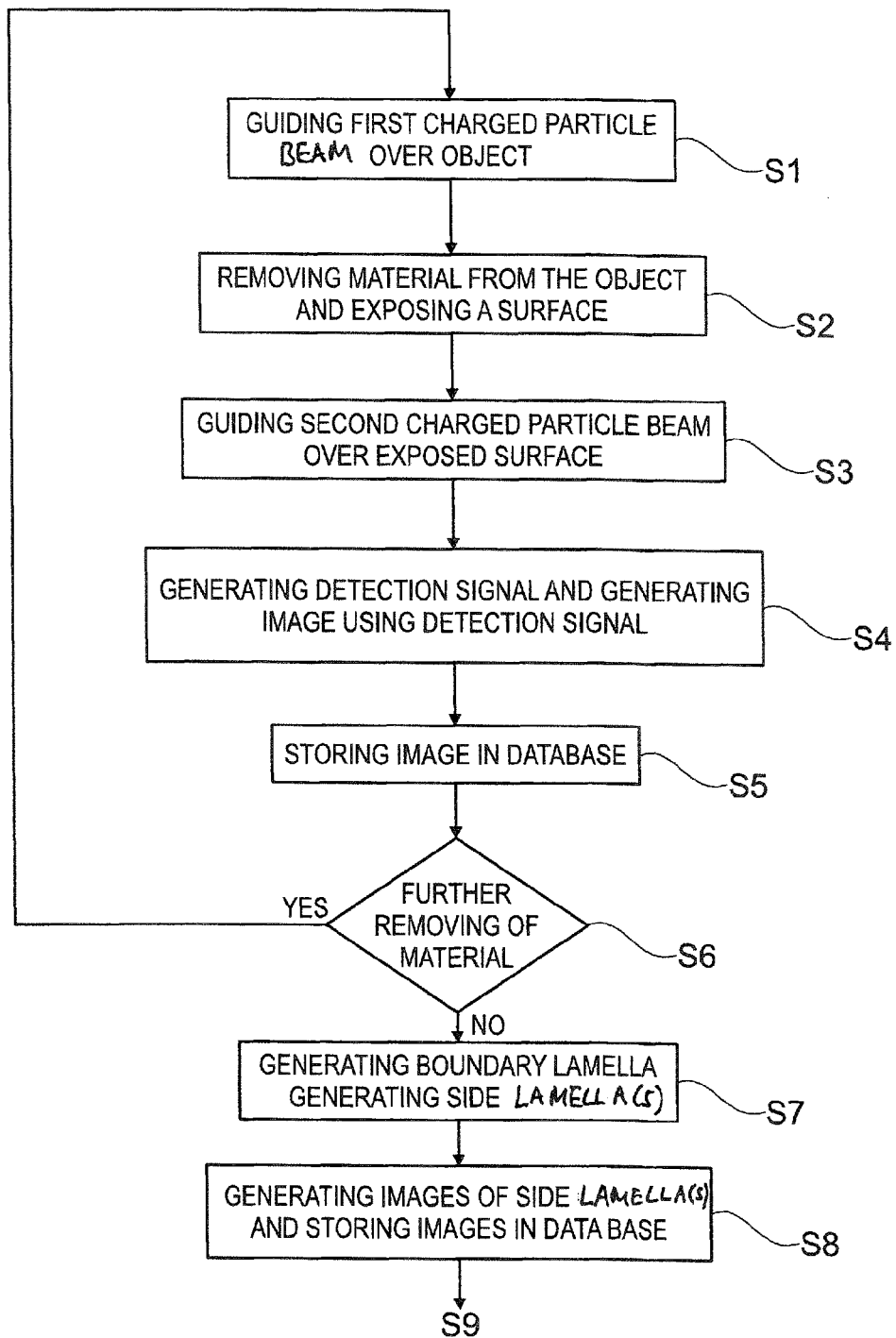
FIG. 4 shows a schematic representation of an embodiment of a first part of a method according to the system described herein.
Figure 6:
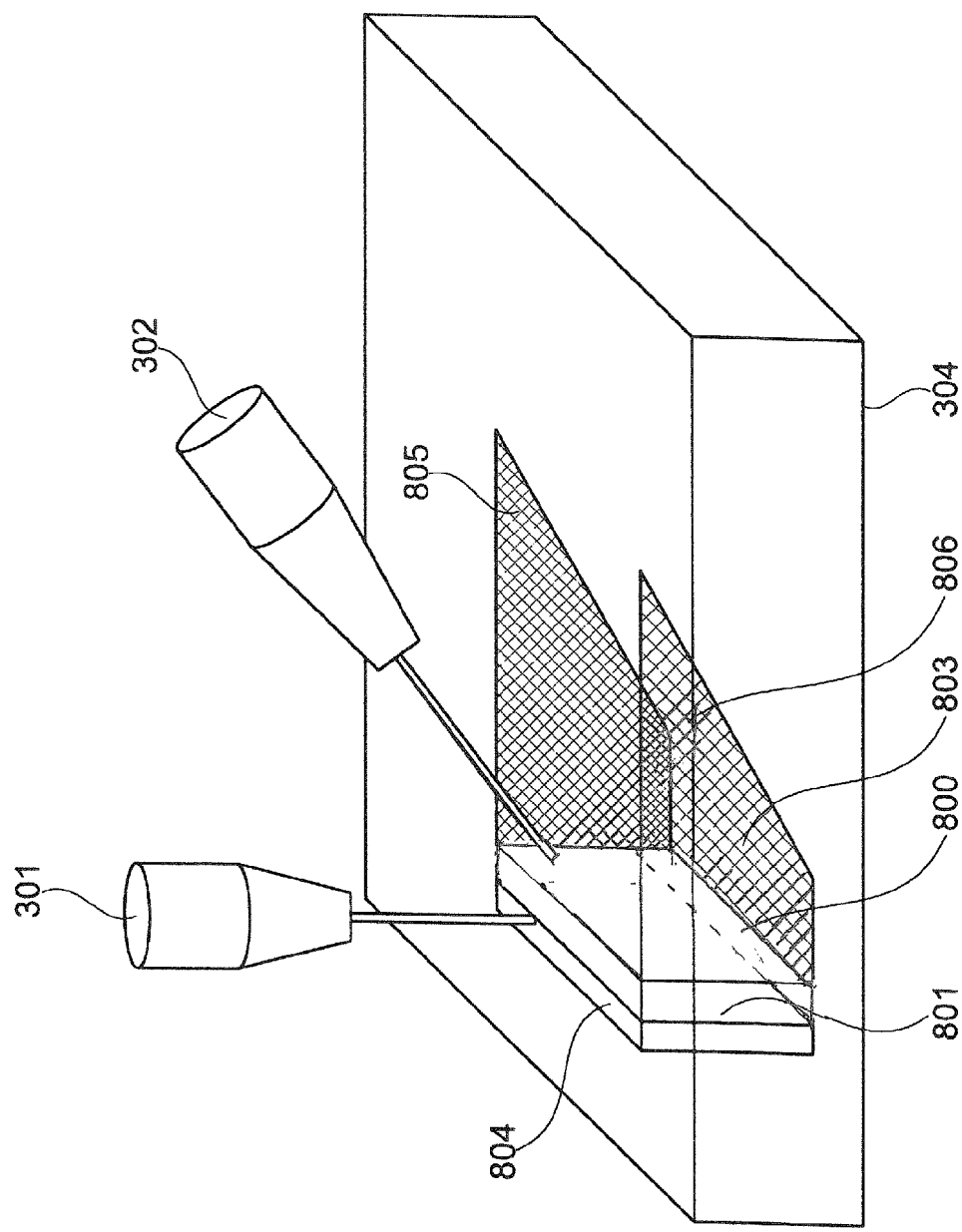
FIG. 6 is a schematic representation of an object, a first particle beam column and a second particle beam column according to the system described herein.

An embodiment of a method according to the system described herein will now be explained. The method is carried out with the charged particle beam device 300 according to FIGS. 1 and 2. FIG. 4 shows a first part of the embodiment of the method. This first part comprises, in particular, generating high resolution 3D data sets by sequentially removing material from the object 304, exposing a surface of the object 304 and generating an image of the surface. The resolution of the image may be 1 nm to 3 nm. More precisely, the first charged particle beam 329 in the form of the ion beam is guided over the object 304 in method step S1. Material is removed from the object 304 when guiding the first charged particle beam 329 over the object 304 (see method step S2). This is schematically shown in FIG. 6. FIG. 6 is a schematic representation of the object 304, the first particle beam column 301 in the form of an ion beam column and the second particle beam column 302 in the form of the electron beam column. When removing material from the object 304, a first surface 800 is exposed. In method step S3, the second charged particle beam 312 in the form of the electron beam is guided over the exposed first surface 800. The second charged particle beam 312 interacts with the material of the exposed first surface 800. Secondary electrons and/or backscattered electrons arise from the interaction. The detector 317 or the particle detector 703 detects those secondary electrons and/or backscattered electrons and generates a first detection signal which is transmitted to the control unit 700. A first image of the exposed first surface 800 is generated using the first detection signal (method step S4). In method step S5, the generated first image is stored in the database 702.

In method step S6, it is decided whether further material is to be removed from the object 304. In the affirmative, method steps S1 to S5 are repeated and a further surface is exposed. In other words, the first charged particle beam 329 is guided over the object 304 again. Material of the object 304 comprising the first surface 800 is removed from the object 304 when guiding the first charged particle beam 329 over the object 304. When removing material, including the first surface 800, a further surface, namely a second surface 801, is exposed (see FIG. 6). An image of the second surface 801 is now generated. The second charged particle beam 312 is guided over the exposed second surface 801. The second charged particle beam 312 interacts with the material of the exposed second surface 801. Secondary electrons and/or backscattered electrons arise from the interaction. The detector 317 or particle detector 703 detects those secondary electrons and/or backscattered electrons and generates a second detection signal which is transmitted to the control unit 700. A second image of the exposed second surface 801 is generated using the second detection signal. The generated second image is stored in the database 702.

It is again decided in method step S6 whether further material is to be removed from the object 304. In the affirmative, method steps S1 to S5 are repeated again and a further surface is exposed. In other words, material of the object 304 is removed from the object 304 slice by slice, wherein each time a slice is removed, a new surface is exposed and imaged. The image of each exposed surface is stored in the database 702. Therefore, method steps S1 to S6 provide for generating high resolution 3D data sets by sequentially removing material from the object 304, exposing surfaces of the object 304 and generating images of the surfaces. For example, up to 1,000 surfaces may be exposed and images of each of the 1,000 surfaces are stored in the database 702. However, the invention is not restricted to this number of surfaces. Rather, any suitable number of surfaces may be exposed and imaged.

As shown in FIG. 6, an opening 803 is generated when removing material from the object 304 and when exposing the surfaces, in particular the first surface 800 and the second surface 801. The opening 803 is bordered by a boundary side 804, a first side 805 and a second side 806. The boundary side 804 may be a bottom side of the opening 803. Therefore, the boundary side 804 comprises the last surface to be exposed when material is removed from the object 304. In the embodiment as shown in FIG. 6, the boundary side 804 comprises the second surface 801. However, the invention is not restricted to the boundary side 804 always comprising the second surface 801. Rather, the boundary side 804 may comprise any surface being the last surface to be exposed when material is removed from the object 304.

The first side 805 extends from the boundary side 804 in a first direction away from the boundary side 804. Moreover, the second side 806 also extends from the boundary side 804 of the object 304 in a second direction away from the boundary side 804. The first direction and the second direction may be identical or may be different. The first side 805 and the second side 806 are arranged opposite to each other. Moreover, the boundary side 804 is arranged between the first side 805 and the second side 806. The boundary side 804, the first side 805 and the second side 806 may form a U-shape (similar to the letter U), the boundary side 804 being the bottom part of the "U", and the first side 805 and the second side 806 being the side pieces of the "U".

In method step S7, a first lamella 807, a second lamella 808 and, optionally, a third lamella 809 are generated using the first charged particle beam 329. The first lamella 807, the second lamella 808 and the third lamella 809 are schematically shown in FIGS. 7A to 7C. They are generated by cutting them out of the object 304 using the first charged particle beam 329. The first lamella 807, the second lamella 808 and the third lamella 809 may be arranged at a holder (not shown) for further analysis. The holder is part of the charged particle beam device 300 and is arranged in the object chamber 303. The first lamella 807 is a boundary lamella. It comprises the boundary side 804 and, thus, the last surface to be exposed when material is removed from the object. In the embodiment shown in FIG. 6, this is the second surface 801. The second lamella 808 is a side lamella. It comprises the first side 805. The third lamella 809 is also a side lamella. It comprises the second side 806. The first lamella 807 may have a thickness T1, the second lamella 808 may have a thickness T2 and/or the third lamella 809 may have a thickness T3. The thicknesses T1 to T3 may be identical or may differ from each other. In particular, each of the thicknesses T1 to T3 may be in the range of 10 nm to 100 nm or in the range of 30 nm to 50 nm. However, the invention is not restricted to the aforementioned ranges. Rather, each of the thicknesses T1 to T3 may have any value suitable for the system described herein.

As mentioned above, the images of the surfaces exposed are generated and stored. In particular, the last surface to be exposed is generated and imaged. In the embodiment of FIG. 6, this surface is the second surface 801. In a further method step S8, images of the second lamella 808 and the third lamella 809 are also generated. The second charged particle beam 312 in the form of the electron beam is guided over the first side 805, which is one of the outer surfaces of the second lamella 808. The second charged particle beam 312 interacts with the material of the first side 805. Secondary electrons and/or backscattered electrons arise from the interaction. The detector 317 or the particle detector 703 detects those secondary electrons and/or backscattered electrons and generates a third detection signal which is transmitted to the control unit 700. A third image of the first side 805 is generated using the third detection signal. The generated third image is stored in the database 702. Moreover, the second charged particle beam 312 in the form of the electron beam is guided over the second side 806, which is one of the outer surfaces of the third lamella 809. The second charged particle beam 312 interacts with the material of the second side 806. Secondary electrons and/or backscattered electrons arise from the interaction. The detector 317 or the particle detector 703 detects those secondary electrons and/or backscattered electrons and generates a fourth detection signal which is transmitted to the control unit 700. A fourth image of the second side 806 is generated using the fourth detection signal. The generated fourth image is stored in the database 702.

Figure 5:
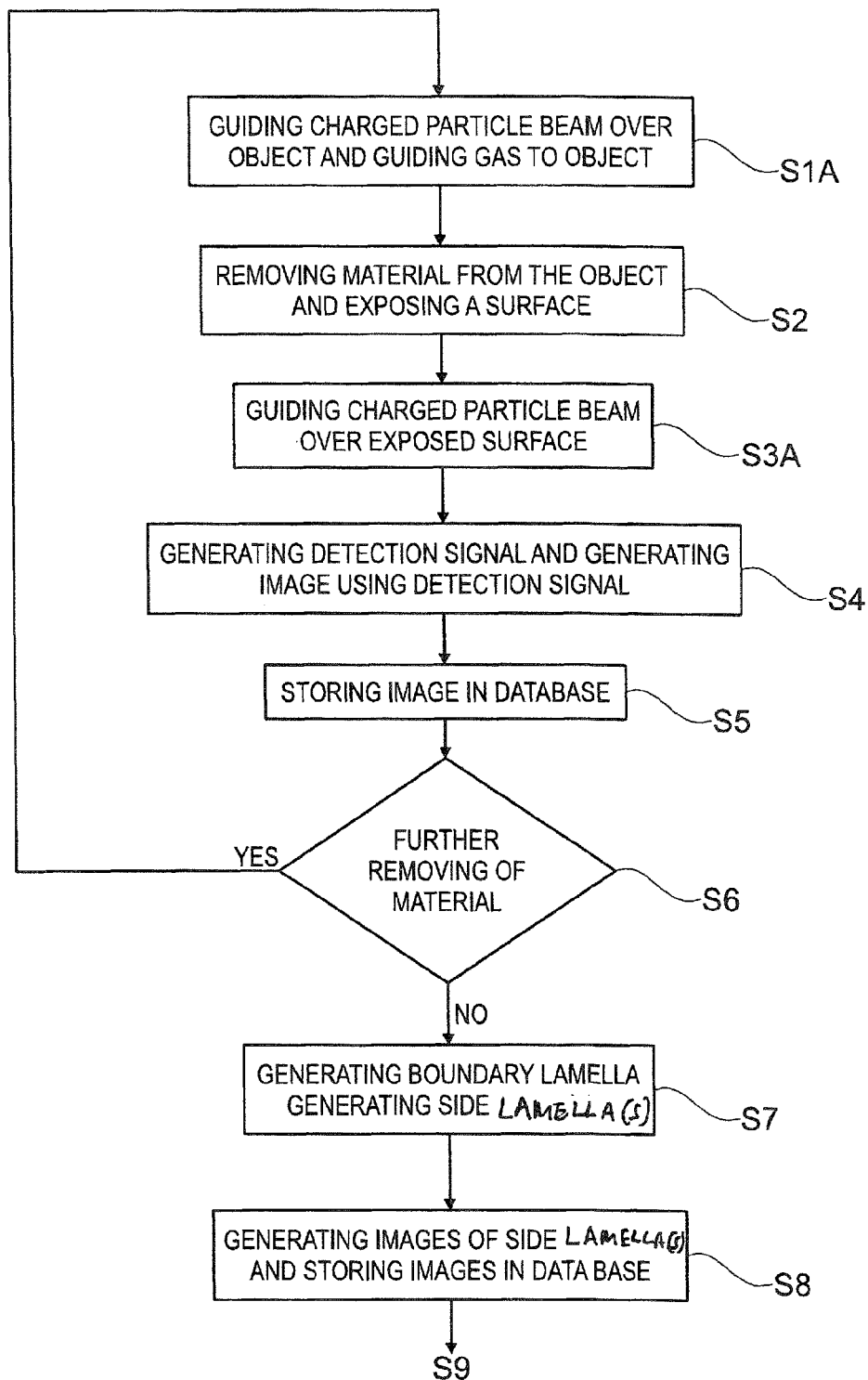
FIG. 5 shows a schematic representation of a further embodiment of a first part of a method according to the system described herein.

An embodiment of a further method according to the system described herein will now be explained. The further method is carried out with the charged particle beam device 300 according to FIG. 3. FIG. 5 shows a first part of the embodiment of the method. This first part comprises, in particular, generating high resolution 3D data sets by sequentially removing material from the object 304, exposing a surface of the object 304 and generating an image of the surface. The resolution of the image may be 1 nm to 3 nm. The first part of the embodiment of the further method according to FIG. 5 is based on the embodiment of FIG. 4. Therefore, the aforementioned explanation with respect to the embodiment of FIG. 4 also applies to the embodiment of FIG. 5. However, instead of method steps S1 and S3, the embodiment of FIG. 5 comprises method steps S1A and S3A. In method step S1A, the second charged particle beam 312 in the form of the electron beam is guided over the object 304. Furthermore, gas is provided by the gas injection unit 337. In method step S2, material is removed from the object 304 using the second charged particle beam 312 and the gas by etching material from the object 304. The first surface 800 of the object 304 is exposed, as explained above. In method step S3A, the second charged particle beam 312 in the form of the electron beam is guided over the exposed first surface 800. The second charged particle beam 312 interacts with the material of the exposed first surface 800. Secondary electrons and/or backscattered electrons arise from the interaction. The detector 317 or the particle detector 703 detects those secondary electrons and/or backscattered electrons and generates a first detection signal which is transmitted to the control unit 700. A first image of the exposed first surface 800 is generated using the first detection signal and is stored in the database. The method steps S1A to S5 are repeated if necessary and as explained above.

The embodiment of FIG. 5 also comprises one difference in method step S7 with respect to the embodiment of FIG. 4. As mentioned above, the first lamella 807, the second lamella 808 and the third lamella 809 are generated in method step S7. However, rather than using the first charged particle beam 329, the first lamella 807, the second lamella 808 and the third lamella 809 are generated by cutting them out of the object 304 by an etching process using the second charged particle beam 312 and the gas provided by the gas injection unit 337.

Figure 8:
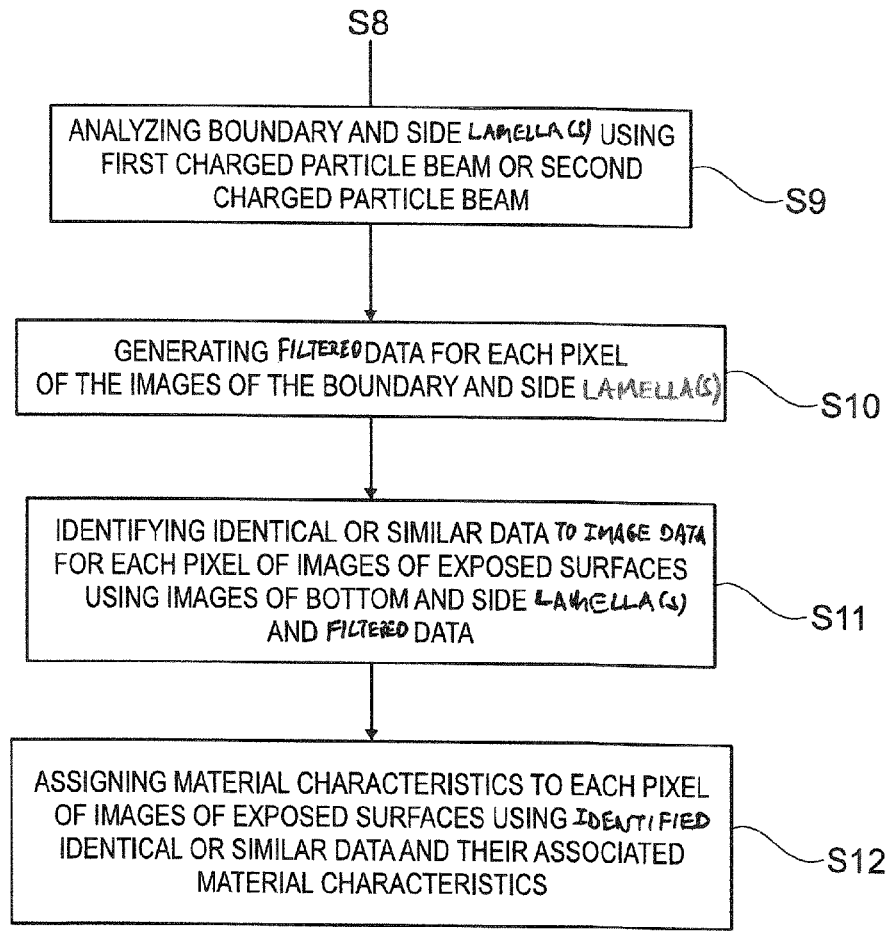
FIG. 8 shows a second part of a method according to the system described herein.

FIG. 8 shows a second part of each of the above mentioned methods, comprising further method steps for the embodiment of FIG. 4 and the embodiment shown in FIG. 5.

In method step S9, material characteristics of the generated lamellas are determined. More precisely, in method step S9, the first lamella 807 (i.e. the boundary lamella), the second lamella 808 and the third lamella 809 are analyzed with respect to their material characteristics using the second charged particle beam 312. In other words, an analysis is carried out to identify the material and/or the composition of elements each lamella has at a particular pixel in its respective image. The material characteristics may also comprise, for example, information about the quantity of a specific element and/or its size and/or its structure contained in the material.

The first lamella 807 is analyzed by identifying first material characteristics of each pixel of the second image pixels of the second image, namely the image of the second surface 801, using the second charged particle beam 312. Interaction radiation, for example X-rays or cathodoluminescence light, is detected using the radiation detector 500. In particular, X-rays may be detected and may be used for carrying out EDX or WDX. EDX and WDX may be used to identify the first material characteristics such as the elements and the composition of elements of the first lamella 807 at each pixel. Additionally or alternatively, interaction particles, for example backscattered electrons, are detected using the EBSD detector 336, which is arranged, for example, in the position Pos A (see FIGS. 1 and 3). EBSD is used to analyze the crystallographic orientation of the material of the first lamella 807. The EBSD detector 336 generates EBSD detection signals. The control unit 700 generates an electron backscatter diffraction pattern (EBSP) of the first lamella 807 based on the EBSD detection signals. The EBSP of the first lamella 807 comprises information about Kikuchi bands corresponding to lattice diffraction planes of the first lamella 807. Additionally or alternatively, the first lamella 807 may also be analyzed by using TKD. The second charged particle beam 312 is guided to the second surface 801. The first lamella 807 is thin enough to be transparent to electrons of the second charged particle beam 312. In other words, the electrons of the second charged particle beam 312 may transmit through the first lamella 807. The scattered and transmitted electrons of the second charged particle beam 312 emerging from a bottom side of the first lamella 807 are detected using the EBSD detector 336, which is arranged in the position Pos B (see FIGS. 1 and 3). The object holder 328 is designed in such a way that the scattered and transmitted electrons may be detected by the EBSD detector 336. The EBSD detector 336 generates detector signals used for acquiring and recording diffraction patterns of the first lamella 807, the diffraction patterns being projected from the bottom side of the first lamella 807 to the EBSD detector 336.

The above mentioned may also apply to the second lamella 808. In other words, the second lamella 808 is analyzed by identifying second material characteristics of each pixel of the third image pixels of the third image, namely the image of the first side 805, using the second charged particle beam 312. X-rays may be used for carrying out EDX or WDX. EDX and WDX may be used to identify the second material characteristics such as the elements and the composition of elements of the second lamella 808 at each pixel. Additionally or alternatively, interaction particles, for example backscattered electrons, are detected using the EBSD detector 336, which is arranged, for example, in the position Pos A (see FIGS. 1 and 3). Again, EBSD is used to analyze the crystallographic orientation of the material of the second lamella 808. Additionally or alternatively, the second lamella 808 may also be analyzed by using TKD. The second charged particle beam 312 is guided to the first side 805 of the second lamella 808. The second lamella 808 is thin enough to be transparent to electrons of the second charged particle beam 312. In other words, the electrons of the second charged particle beam 312 may transmit through the second lamella 808. The scattered and transmitted electrons of the second charged particle beam 312 emerging from a bottom side of the second lamella 808 are detected using the EBSD detector 336, which is arranged in the position Pos B (see FIGS. 1 and 3).

The above mentioned may also apply to the third lamella 809. In other words, the third lamella 809 is analyzed by identifying third material characteristics of each pixel of the fourth image pixels of the fourth image, namely the image of the second side 806, using the second charged particle beam 312. X-rays may be used for carrying out EDX or WDX. EDX and WDX may be used to identify the third material characteristics such as the elements and the composition of elements of the third lamella 809 at each pixel. Additionally or alternatively, interaction particles, for example backscattered electrons, are detected using the EBSD detector 336, which is arranged, for example, in the position Pos A (see FIGS. 1 and 3). EBSD is used to analyze the crystallographic orientation of the material of the third lamella 809. Additionally or alternatively, the third lamella 809 may also be analyzed by using TKD. The second charged particle beam 312 is guided to the second side 806 of the third lamella 809. The third lamella 809 is thin enough to be transparent to electrons of the second charged particle beam 312. In other words, the electrons of the second charged particle beam 312 may transmit through the third lamella 809. The scattered and transmitted electrons of the second charged particle beam 312 emerging from a bottom side of the third lamella 809 are detected using the EBSD detector 336, which is arranged in the position Pos B (see FIGS. 1 and 3).

The embodiments of the above mentioned methods now provide for generating filtered data for each pixel or a group of pixels of the generated images of the first lamella 807, the second lamella 808 and the third lamella 809. More precisely, filtered data is generated for each pixel of the second image of the second surface 801 of the first lamella 807, of the third image of the first side 805 of the second lamella 808 and of the fourth image of the third side 806 of the third lamella 809. In other words, first filtered data of each pixel of the second image pixels is generated using at least one first image filter for processing the second image data for each pixel of the second image pixels. Moreover, second filtered data of each pixel of the third image pixels is generated using at least one second image filter for processing the third image data for each pixel of the third image pixels. Furthermore, third filtered data for each pixel of the fourth image pixels is generated using at least one third image filter for processing the fourth image data for each pixel of the fourth image pixels. In other words, each pixel of the second image pixels, of the third image pixels and/or of the fourth image pixels is filtered using at least one image filter. The first image filter, the second image filter and the third image filter may each be a digital image filter. In particular, at least one of the aforementioned filters may be one of the following filters: a Gabor filter, a mean filter, a variance filter, a histogram oriented gradient filter, a maximum filter, a minimum filter and a Kuwahara filter. The first image filter, the second image filter and the third image filter may not be identical. However, in one embodiment of the system described herein, at least two of the filters, namely the first image filter, the second image filter and the third image filter, are identical. For example, all image filters can be identical. Moreover, in a further embodiment of the system described herein, more than one image filter is used for generating filtered data for a particular pixel, thus generating more than one image based on filtered data using different image filters.

Figure 9A:
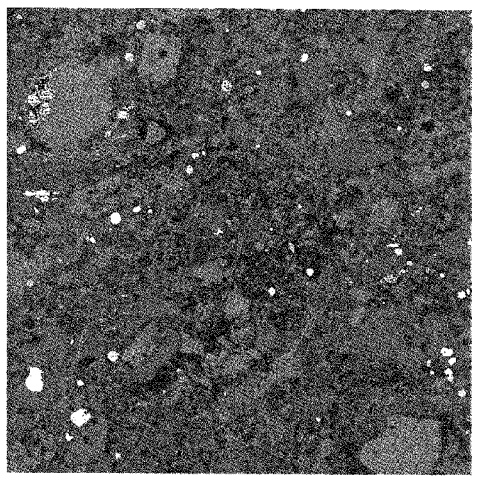
FIGS. 9A-9I show filtered images of a surface of an object.
Figure 9B:
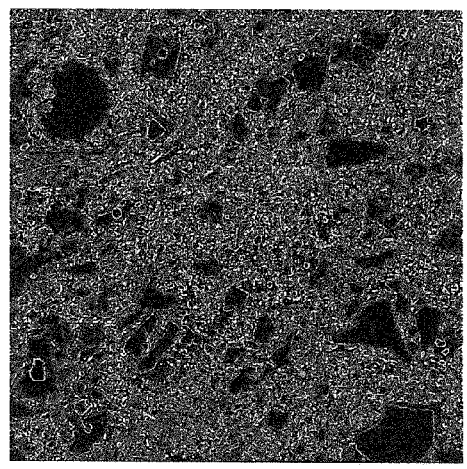
Figure 9C:
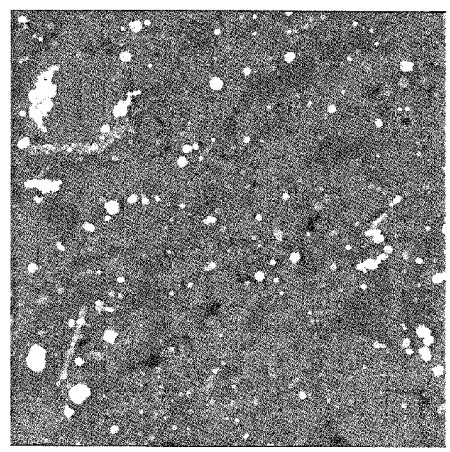
Figure 9D:
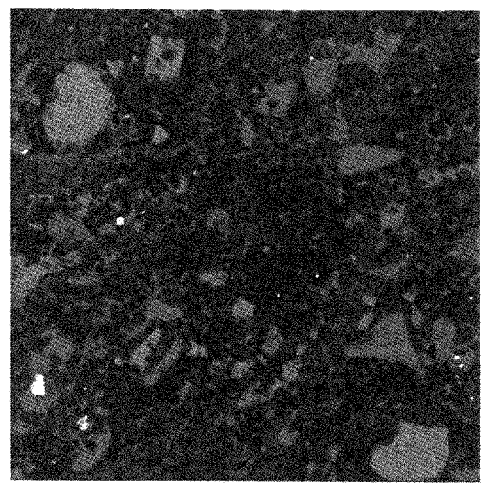
Figure 9E:
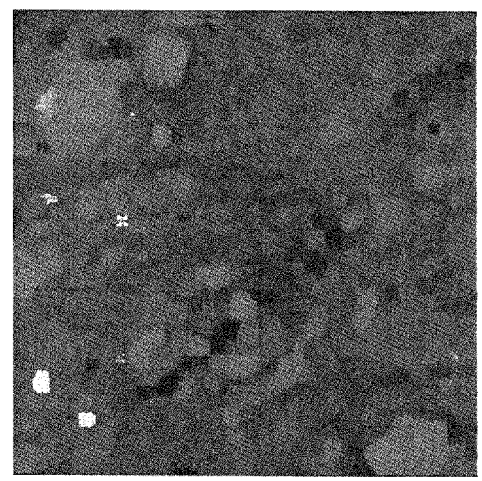
Figure 9F:
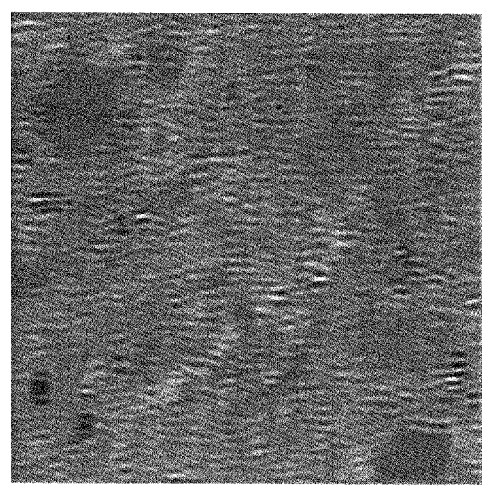
Figure 9G:
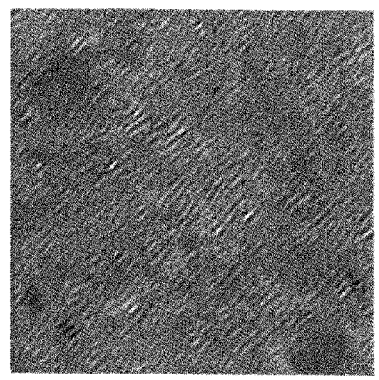
Figure 9H:
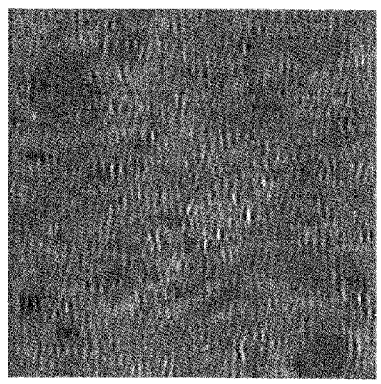

The aforementioned is further explained with respect to the second image of the second surface 801 only. As mentioned above, the second surface 801 is part of the first lamella 807. FIG. 9A schematically shows the image of the second surface 801. As mentioned above, this image was generated using the second charged particle beam 312 and detecting interaction particles such as secondary electrons and/or backscattered electrons using the detector 317. A first image filter in the form of a convolution filter is now used to generate a first filtered image of the second image. The convolution filter is used to filter each pixel of the second image of the second surface 801 shown in FIG. 9A. The generated first filtered image is shown in FIG. 9B. Additionally, a second image filter in the form of a maximum filter is now used to generate a second filtered image of the second image. The maximum filter is used to filter each pixel of the second image of the second surface 801 shown in FIG. 9A. The generated second filtered image is shown in FIG. 9C. Moreover, a third image filter in the form of a minimum filter is now used to generate a third filtered image of the second image, wherein the minimum filter is used to filter each pixel of the second image of the second surface 801 shown in FIG. 9A. The generated third filtered image is shown in FIG. 9D. A fourth image filter in the form of a Kuwahara filter is now used to generate a fourth filtered image of the second image, wherein the Kuwahara filter is used to filter each pixel of the second image of the second surface 801 shown in FIG. 9A. The generated fourth filtered image is shown in FIG. 9E. A fifth image filter in the form of a first Gabor filter having first parameters is now used to generate a fifth filtered image of the second image, wherein the first Gabor filter is used to filter each pixel of the second image of the second surface 801 shown in FIG. 9A. The generated fifth filtered image is shown in FIG. 9F. A sixth image filter in the form of a second Gabor filter having second parameters is now used to generate a sixth filtered image of the second image, wherein the second Gabor filter is used to filter each pixel of the second image of the second surface 801 shown in FIG. 9A. The generated sixth filtered image is shown in FIG. 9G. A seventh image filter in the form of a third Gabor filter having third parameters is now used to generate a seventh filtered image of the second image, wherein the third Gabor filter is used to filter each pixel of the second image of the second surface 801 shown in FIG. 9A. The generated seventh filtered image is shown in FIG. 9H.

Figure 9I:
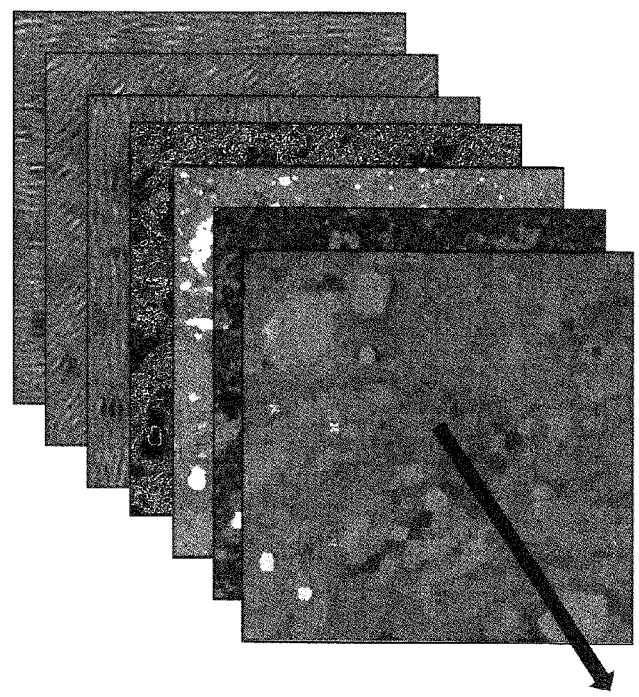

After having carried out method step S10, several filtered images have been generated associated to the second image, to the third image and to the fourth image. Therefore, it is possible to generate a vector for each of the second image, the third image and the fourth image for each pixel of each filtered image, the vector comprising the filtered data for each filtered image for a particular pixel. This is schematically shown in FIG. 9I. FIG. 9I schematically shows the several generated filtered images, namely the first filtered image to the seventh filtered image. A vector may be guided through each pixel of the first filtered image to the seventh filtered image. The vector comprises for each pixel filtered data of each filtered image. In other words, the vector is a feature vector. It may have the form $$\vec{v} = (D1, D2, \ldots, D6, D7) \quad [1]$$

where $\vec{v}$ is the vector for a specific pixel;
D1 is the filtered data at this specific pixel in the first filtered image;
D2 is the filtered data at this specific pixel in the second filtered image;
D3 is the filtered data at this specific pixel in the third filtered image;
D4 is the filtered data at this specific pixel in the fourth filtered image;
D5 is the filtered data at this specific pixel in the fifth filtered image;
D6 is the filtered data at this specific pixel in the sixth filtered image;
D7 is the filtered data at this specific pixel in the seventh filtered image;

The information with respect to the identified material characteristics and the filtered data of the filtered images is now used to obtain information on the material characteristics for each pixel of each surface generated when material is sequentially removed from the object 304 (method steps S11 and S12). In particular, one of the following methods may be used: a random decision forest, association rule learning, an artificial neural network, a support vector machine and a Bayesian network. The aforementioned methods are machine learning methods for classification, wherein classification is the problem of identifying to which of a set of categories a new set of data belongs. The embodiments of FIGS. 4 and 5 may use a random decision forest which is explained using FIGS. 10 to 13. The process of using the random decision forest comprises three steps, namely a first step, a second step and a third step. The random decision forest is trained (first step) and the training is validated (second step). After validation, the random decision forest may be used to classify and assign material characteristics to each pixel of each surface generated and imaged (third step).

Figure 10:
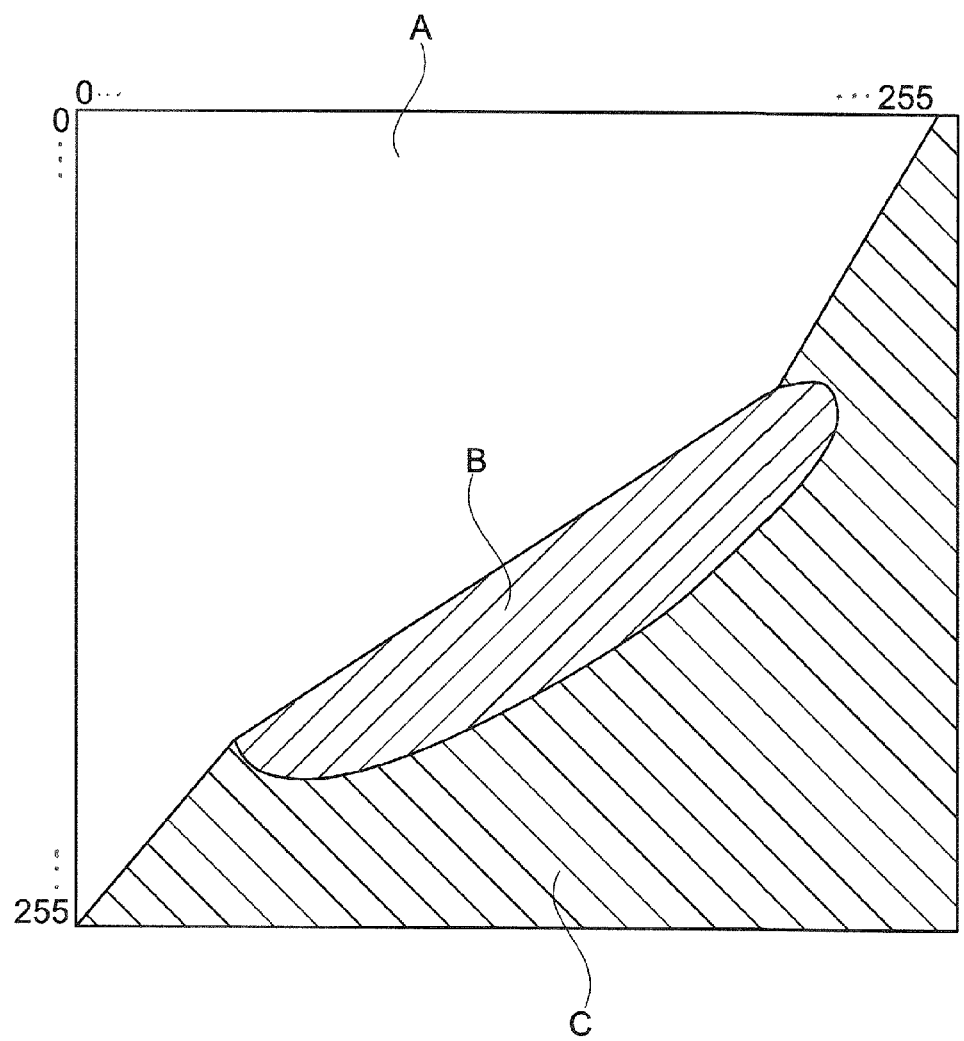
FIG. 10 is an image of a surface used as a training image for a random decision forest according to the system described herein.

The first step is now discussed. For easier illustration, we assume that the image of the second surface 801 as shown in FIG. 9A is actually an image as shown in FIG. 10. The image shown in FIG. 10 is called training image hereinafter. The training image may comprise 256×256 pixels, which would mean a total of 65536 pixels. The invention is not restricted to such number of pixels. Rather, each image of each surface generated when material is sequentially removed from the object 304 may comprise any number of pixels suitable for carrying out the invention.

Each pixel of the training image has a specific material characteristic (hereinafter referred to as a "class"). The training image comprises pixels belonging to three different classes, namely classes A, B and C.

The training image is used for carrying out method step S10. As mentioned above, after having carried out method step S10, several filtered images have been generated associated to the training image. A vector may be generated for the training image as shown in FIG. 9I. It is now possible for each filtered image, namely the first filtered image, the second filtered image, the third filtered image, the fourth filtered image, the fifth filtered image, the sixth filtered image and the seventh filtered image, to determine a gray value at each pixel from each filtered image, for example by reading out the pixel values from each filtered image or by using an image recognition algorithm known in the art, for example a thresholding process. The gray values obtained at each pixel of the first to seventh filtered images are stored in the database 702 and are arranged in a table together with the gray values at each pixel of the training image. The table may have the following form:

TABLE 1

| Pixel # | GV0 | GV1 | GV2 | GV3 | GV4 | GV5 | GV6 | GV7 | Class |
|---|---|---|---|---|---|---|---|---|---|
| 1 | 204 | 205 | 181 | 226 | 129 | −0.06 | 207 | 205 | A |
| 2 | 200 | 203 | 179 | 222 | 125 | −0.05 | 203 | 202 | A |
| 3 | 198 | 196 | 177 | 220 | 122 | −0.04 | 195 | 196 | A |
| ... | ... | ... | ... | ... | ... | ... | ... | ... | ... |
| 32768 | 172 | 170 | 155 | 194 | 253 | 0.2 | 166 | 160 | B |
| 32769 | 171 | 169 | 154 | 193 | 252 | 0.19 | 164 | 159 | B |
| ... | ... | ... | ... | ... | ... | ... | ... | ... | ... |
| 65535 | 147 | 147 | 87 | 203 | 253 | 0.01 | 144 | 145 | C | where
Pixel # is the number of the pixel in the training image;
GV0 is the gray value of a specific pixel in the training image;
GV1 is the gray value of a specific pixel in the first filtered image;
GV2 is the gray value of a specific pixel in the second filtered image;
GV3 is the gray value of a specific pixel in the third filtered image;
GV4 is the gray value of a specific pixel in the fourth filtered image;
GV5 is the gray value of a specific pixel in the fifth filtered image;
GV6 is the gray value of a specific pixel in the sixth filtered image;
GV7 is the gray value of a specific pixel in the seventh filtered image; and where class is the class (i.e. the material characteristic) the pixel belongs to.

Figure 11A:
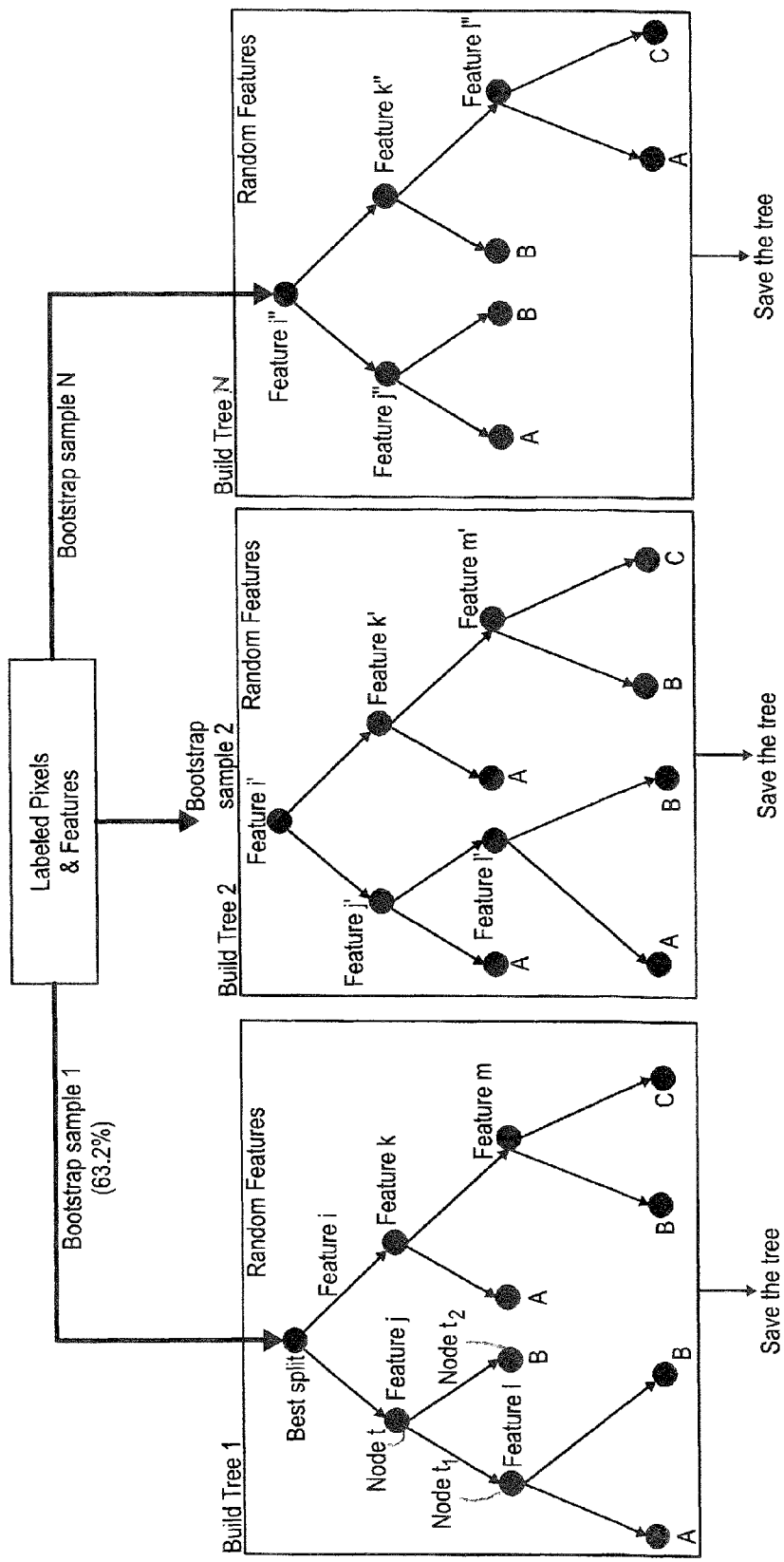
FIG. 11A is a schematic representation of a training phase of a random decision forest according to the system described herein.
Figure 11:
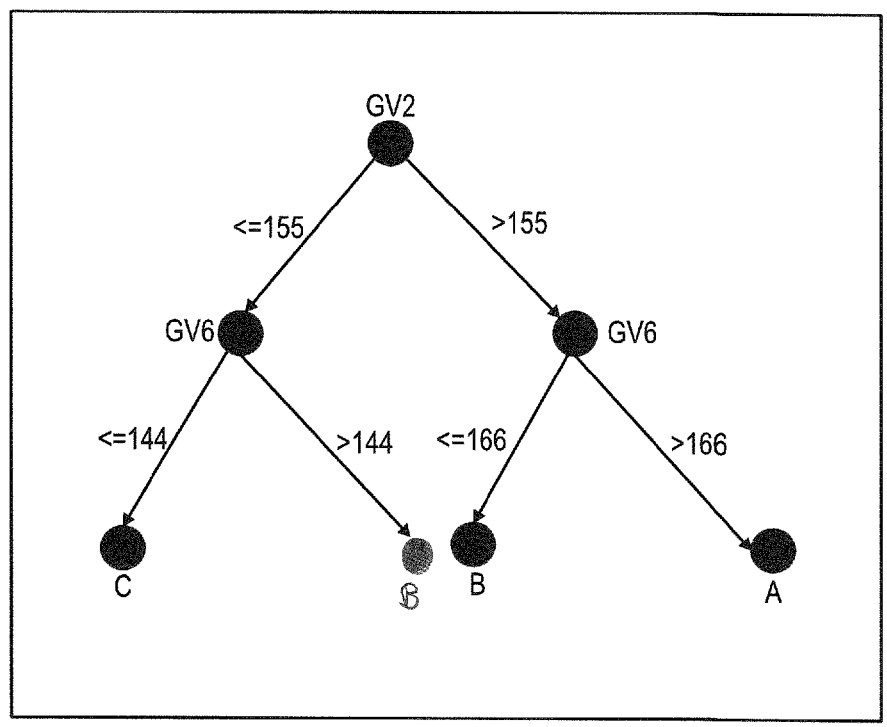
FIG. 11B is a schematic representation of a decision tree in the training phase of a random decision forest according to the system described herein.

The random decision forest is now trained as shown in FIG. 11A. During the training process, the random forest algorithm builds a model. This model is based on decision trees which comprise nodes with specific rules for splitting. Each node of a decision tree represents a feature which is a gray value of a specific pixel in a specific filtered image. The nodes of a decision tree may branch into two branches of the decision tree. If the value of the pixel for that feature is less than or equal to a specific value, then the pixel travels down a specific branch of the decision tree, for example the left branch. If the value of the pixel of that feature is more than the specific value, it travels down the other branch of the decision tree, for example the right branch. This will be explained in detail below.

The random decision forest method comprises several decision trees, namely decision trees 1 to N, wherein N is an integer. N might be any integer which is sufficient for carrying out the system described herein. For example, N can be in the range of 100 to 300, or in the range of 100 to 200. In an exemplary embodiment of the system described herein, N is 100. Therefore, this exemplary embodiment comprises 100 decision trees. The training of the random decision forest is carried out using the data comprised in table 1. More precisely, each decision tree of the decision trees 1 to N is generated using the data of pixels from table 1 which are randomly selected. Therefore, those pixels are also called random sample of pixels or boot strap sample hereinafter. Typically, 63.2% of all available pixels and their corresponding data shown in table 1 are used as the random sample of pixels (random sample of features). Each decision tree 1 to N has its own random sample of pixels. Therefore, the random sample of pixels is randomly selected for each decision tree 1 to N.

The generation of decision tree 1 is now explained in detail. Decision trees 2 to N are generated in the same manner. Decision tree 1 comprises nodes whose number is randomly selected. For each node of decision tree 1, two features are randomly selected out of the random sample of features, for example GV1 as feature 1 and GV6 as feature 2. It is then decided whether feature 1 or feature 2 would be used for the node based on the best split criteria. The best split criteria also determines the split values for the node.

The best split is based on the so-called Gini impurity criterion. The Gini impurity criterion is a measure of how often a randomly chosen element from a set would be incorrectly labeled if it was randomly labeled according to the distribution of labels in a subset. The Gini impurity index at each node t in a decision tree is defined as:

$$G(t) = 1 - \Sigma_{i=1}^{n} \qquad [2]$$

where
G is the Gini impurity index,
$p_i$ is the ratio of a specific class at the node t, and wherein n is the total number of classes.

After splitting a node t into a first child node $t_1$ and a second child node $t_2$, the Gini index of split data is defined as:

$$Gini_{split}(t) = \frac{N_1(t)}{N(t)} G(t_1) + \frac{N_2(t)}{N(t)} G(t_2) \qquad [3]$$

where
N(t) is the total number of available or selected pixels,
$N(t_1)$ is the number of pixels belonging to specific classes at a node $t_1$, and
$N(t_2)$ is the number of pixels belonging to specific classes at a node $t_2$.

The feature providing the smallest $Gini_{split}(t)$ is chosen for the node. This is explained in detail further below using a specific embodiment. We assume that GV2 as feature 1 and GV6 as feature 2 are randomly selected out of the random sample of features for a node t. It is then decided whether feature 1 or feature 2 is used for the node t based on the best split criteria. For simpler presentation purposes we further assume that only 6 pixels of GV2 and GV6 are available, namely

TABLE 2

| Pixel # | GV2 | GV6 | Class |
| --- | --- | --- | --- |
| 1 | 181 | 207 | A |
| 2 | 179 | 203 | A |
| 3 | 177 | 195 | A |
| 32768 | 155 | 166 | B |
| 32769 | 154 | 164 | B |
| 65535 | 87 | 144 | C |

The total number of selected pixels is 6, therefore N(t)=6. $Gini_{split}(t)$ is now calculated for the feature 1, namely GV2:

TABLE 3

| Subnode | Split criteria | Class A | Class B | Class C | Pixels $N_i(t)$ | G(t) | $Gini_{split}$ |
| --- | --- | --- | --- | --- | --- | --- | --- |
| $t_1$ | GV2 <= 87 | 0 | 0 | 1 | 1 | 0 | 0.4 |
| $t_2$ | GV2 > 87 | 3 | 2 | 0 | 5 | 0.48 | |
| $t_1$ | GV2 <= 154 | 0 | 1 | 1 | 2 | 0.5 | 0.4166667 |
| $t_2$ | GV2 > 154 | 3 | 1 | 0 | 4 | 0.375 | |
| $t_1$ | GV2 <= 155 | 0 | 2 | 1 | 3 | 0.444444 | 0.2222222 |
| $t_2$ | GV2 > 155 | 3 | 0 | 0 | 3 | 0 | |
| $t_1$ | GV2 <= 177 | 1 | 2 | 1 | 4 | 0.625 | 0.4166667 |
| $t_2$ | GV2 > 177 | 2 | 0 | 0 | 2 | 0 | |
| $t_1$ | GV2 <= 179 | 2 | 2 | 1 | 5 | 0.64 | 0.53333333 |
| $t_2$ | GV2 > 179 | 1 | 0 | 0 | 1 | 0 | |

The smallest $Gini_{split}(t)$ is for GV2<=155. $Gini_{split}(t)$ is now calculated for the feature 2, namely GV6, in an identical manner. We assume that $Gini_{split}(t)$ for GV6 is higher than $Gini_{split}(t)$ for GV2. Therefore, GV2 is selected as the feature for the node t. The specific value is 155. If a pixel having a certain gray value to be evaluated runs down the decision tree and if the gray value of that pixel is less than or equal to 155, the pixel runs down the left branch of the node t to the node $t_1$. If a pixel having a certain gray value to be evaluated runs down the decision tree and if the gray value of that pixel is higher than 155, the pixel runs down the right branch of node t to the node $t_2$.

The aforementioned is carried out for each node of each decision tree 1 to N. An embodiment of a decision tree is shown in FIG. 11B. The end nodes (hereinafter called terminal nodes) are assigned to that class of the pixel used for training which is ending up at a specific terminal node and which was already labeled and assigned to a specific class. For example, the terminal node at the far left comprises a pixel which has a grey value <=144. Therefore, this terminal node is assigned to class C since the gray value of pixel 65535 (which is 144) of GV6 belongs to class C.

As mentioned above, decision trees 2 to N are generated in analogy to the generation of decision tree 1.

Figure 12:
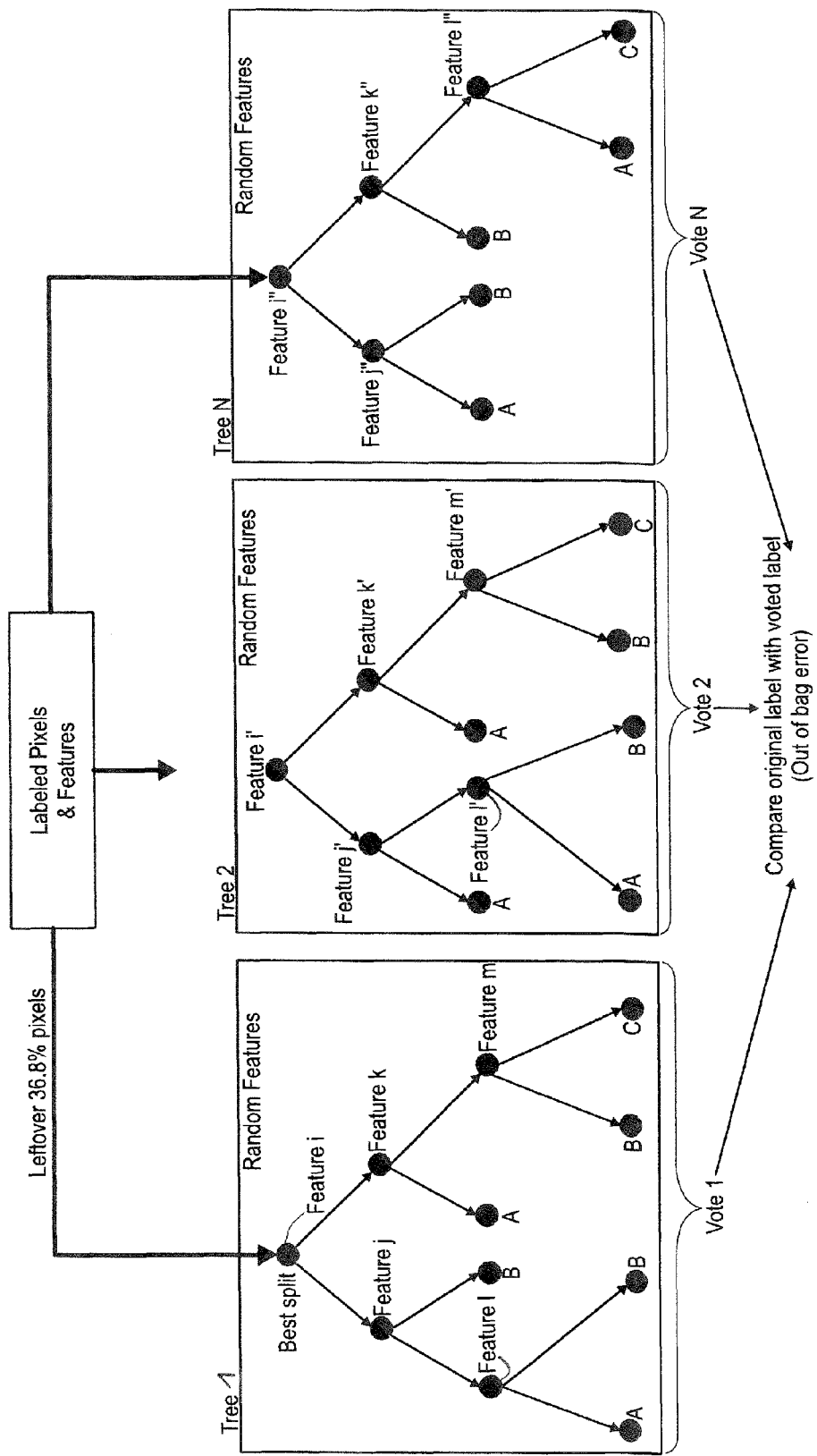
FIG. 12 is a schematic representation of a validation phase of a random decision forest according to the system described herein.
Figure 13:
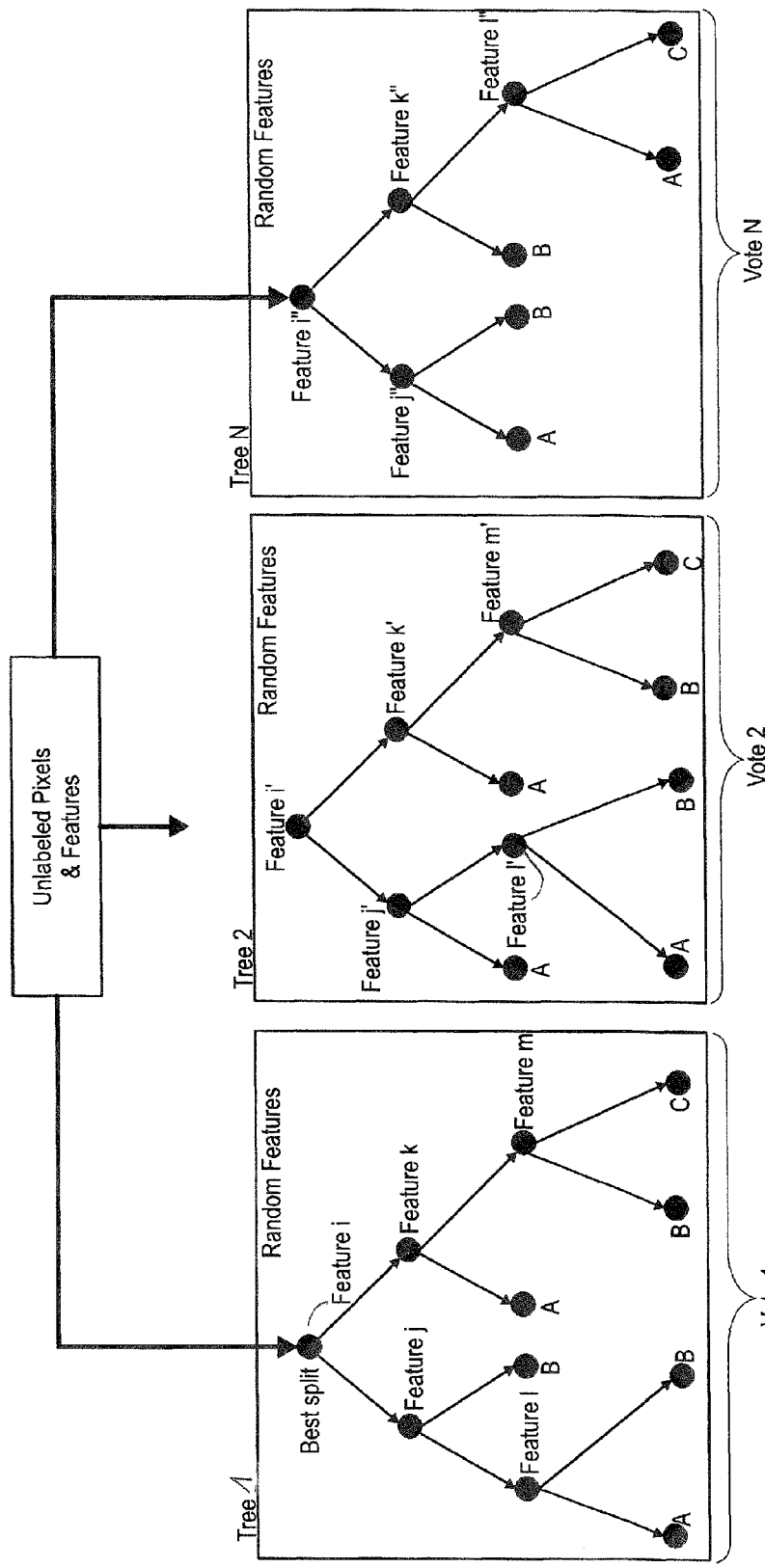
FIG. 13 is a schematic representation of a classification phase of a random decision forest according to the system described herein.

As mentioned above, in the second step, the training of the random decision forest is validated. The validation is shown in FIG. 12. The validation of decision tree 1 is now explained in detail. Decision trees 2 to N are validated in the same manner.

For validation of decision tree 1, the remaining 36.8% pixels and their corresponding data of table 1 which have not been used for training are now used for validation. Those pixels and their corresponding data now used for validation are also called out-of-bag data. Since the pixels used for training each decision tree 1 to N are randomly selected in each case, the out-of-bag data for each decision tree 1 to N differ from each other. Each pixel of the out-of-bag data of decision tree 1 is pushed down decision tree 1. The pixel is guided down decision tree 1. It is decided at each node of decision tree 1 whether the pixel has to be pushed down the left branch or the right branch depending on the gray value of the pixel. If the gray value of the pixel is lower than or equal to the specific value as above mentioned then the pixel travels down the left branch. If the gray value of the pixel is higher than the specific value as above mentioned then the pixel travels down the right branch. Each pixel of the out-of-bag data being pushed down decision tree 1 ends up at a terminal node. As mentioned above, the terminal node is assigned to a specific class, namely class A, B or C, in the embodiment described here. Therefore, when the pixel of the out-of-bag data being pushed down decision tree 1 ends up at a terminal node, decision tree 1 has voted that this specific pixel has the same class as the class being assigned to this terminal node. This means that the decision tree 1 has voted that the class of this specific pixel is the same as the one assigned to this terminal node.

Step 2, namely the validation of the random decision forest, also comprises calculating the misclassification rate (the so called out-of-bag error rate) by comparing the class of each pixel as mentioned in table 1 to the class assigned by each decision tree 1 to N. The out-of-bag error rate of all decision trees 1 to N of the random decision forest is aggregated to determine an overall out-of-bag error rate. If the overall out-of-bag error rate is too high (for example, higher than 0.4), the training is repeated with more data included in the random sample of pixels than before.

The generated random decision forest is now used to classify each pixel of each image of each surface generated when material is sequentially removed from the object 304, wherein the pixels of these images have not yet been analyzed with respect to the material characteristics. This is step 3 as mentioned above. Each pixel from these images is pushed down each decision tree 1 to N. The pixel is guided down each decision tree. It is decided at each node of each decision tree whether the pixel has to be pushed down the left branch or the right branch depending on the gray value of the pixel as mentioned above. Each pixel being pushed down each decision tree 1 to N ends up at a terminal node. As mentioned above, the terminal nodes are assigned to a specific class, namely class A, B or C in the embodiment described here. Therefore, when each pixel ends up at a terminal node of decision trees 1 to N, decision trees 1 to N have voted that this specific pixel has the same class as the class being assigned to this terminal node. This means that decision trees 1 to N have voted that the class of a specific pixel is the same as the one assigned to a terminal node. Now, the probability $P_{class}$ for each pixel to be part of a specific class is calculated as the ratio of total votes for the class to the total numbers of decision trees:

$$P_{class} = \frac{\text{total votes for the class}}{\text{total number of decision trees}} \quad [4]$$

If the total number of decision trees is, for example, 100 (i.e. N=100), and 95 of the decision trees vote that a specific pixel is part of class A, then the probability of the pixel to be classified in class A would be 0.95.

After carrying out step 3, it is possible to generate probability maps for each class. Moreover, a segmented image for each image of each generated surface is then generated by assigning the class at each pixel based on the highest probability. The segmented image comprises information on the material characteristics of the object 304 at each pixel. The segmented images may then be used to generate a 3D analytical data set of the object 304 which is already known in the art, for example in WO 2010/108852 A1, which is incorporated herein by reference.

The workflows depicted in FIGS. 4,5 and 8 can be summarized as follows: When conducting the steps S1 to S5 (FIG. 4) or steps S1A to S5 (FIG. 5), a first data set of a three dimensional measurement volume of the object with a high resolution using the charged particle beam is obtained. This first data set is based on detected interaction particles leaving the object due to an impingement of the charged particle beam. The first data set comprises a plurality of individual voxels.

In step S7, at least one lamella is extracted from the object from a region neighbored to the three dimension measurement volume by using the charged particle beam device.

In step S8, a second data set of the at least one lamella with a high resolution is obtained using said charged particle beam. This second data set is also based on detected interaction particles leaving the object due to an impingement of the charged particle beam.

In step S9, charged particle beam analytics using the charged particle beam device is performed at the at least one lamella to identify material characteristics of the at least one lamella. The charged particle beam analytics can be at least one of: EDX, WDX, EBSD and TKD. The resolution of the charged particle beam analytics achieved in this step is considerable lower than the high resolution imaging data of the first and second data set. However, since the charged particle beam analytics are performed at the at least one lamella having a thickness of 10-100 nm, the resolution of the charged particle beam analytics achieved in this step is still in the range some ten nm, i.e. 10 to 30 nm, and, accordingly, is much higher than the resolution which could be achieved if the charged particle beam analytics were performed on a larger object directly.

In step S10, data of said second data set, high-resolution material contrast image data of the at least one lamella, are allocated to said material characteristics of the lamella identified in step 9.

In step S12, material characteristics are allocated to said individual voxels representing the three dimensional measurement volume of the object based on said allocation of said second data set to said material characteristics performed in step S10. In the above described way, the resolution of the charged particle beam analytics achieved in step S9 is transferred in step 12 to the complete three dimensional measurement volume of the object from which the data in the first data set are collected.

In an embodiment in step S7, two additional lamellas are extracted from the object, whereby said additional lamellas are extracted at different sides relative to said three dimensional measurement volume. In this embodiment in step S9, charged particle analytics are also performed at these two additional lamellas so that altogether charged particle analytics are performed at three lamellas extracted at three different sides relative to said three dimensional measurement volume.

In a further embodiment, the workflow can include a further step S10 in which first feature vectors are generated based on said second data set by performing data filtering. In such embodiment, the allocation of data of said second data set to material characteristics can be performed by allocating particular feature vectors to particular material characteristics. In such embodiment, in addition, in an additional intermediate step S11, second feature vectors can be generated based on said first data set by performing data filtering. The allocation of material characteristics to the individual voxels of the first data set can be carried out by comparing said first feature vectors with said second feature vectors and identifying regions in the first data set which have similar feature vectors as regions in the lamella(s). Regions within the three dimensional measurement volume having feature vectors which are similar to a particular feature vector in the lamella(s) are supposed to have a similar material characteristic as the respective location in the lamella.

The embodiments of the invention have the advantages mentioned above.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

The invention claimed is:

1. A method for analyzing an object using a charged particle beam device having a first charged particle beam generator for generating a first charged particle beam having first charged particles, a first objective lens for focusing the first charged particle beam onto the object, a second charged particle beam generator for generating a second charged particle beam having second charged particles, a second objective lens for focusing the second charged particle beam onto the object, a first detection unit and a second detection unit, the method comprising:

guiding the first charged particle beam over the object, removing material from the object using the first charged particle beam, exposing a first surface of the object when removing the material from the object, guiding the second charged particle beam over the first surface of the object, detecting first interaction particles using the first detection unit, the first interaction particles arising when the second charged particle beam impinges on the first surface, generating a first detection signal using the first detection unit and generating a first image of the first surface of the object using the first detection signal, the first image comprising first image pixels, each pixel of the first image pixels comprising first image data;

guiding the first charged particle beam over the object, removing material comprising the first surface from the object using the first charged particle beam, exposing a second surface of the object when removing the material from the object, guiding the second charged particle beam over the second surface of the object, detecting second interaction particles using the first detection unit, the second interaction particles arising when the second charged particle beam impinges on the second surface, generating a second detection signal using the first detection unit and generating a second image of the second surface of the object using the second detection signal, the second image comprising second image pixels, each pixel of the second image pixels comprising second image data, wherein an opening is generated when removing the material from the object so as to expose the first surface and the second surface of the object, wherein the opening comprises a first side comprising the second surface and a second side extending from the second surface of the object in a direction away from the second surface;

generating a first lamella comprising the first side of the opening having the second surface as an outer surface, and generating a second lamella comprising the second side of the opening;

guiding the second charged particle beam over the second side of the object, detecting third interaction particles using the first detection unit, the third interaction particles arising when the second charged particle beam impinges on the second side of the object, generating a third detection signal using the first detection unit and generating a third image of the second side of the object using the third detection signal, the third image comprising third image pixels, each pixel of the third image pixels comprising third image data;

analyzing the first lamella by identifying first material characteristics of the first lamella associated to each pixel of the second image pixels using at least one of: the first charged particle beam and the second charged particle beam, and detecting at least one of: fourth interaction particles and first interaction radiation using the second detection unit;

analyzing the second lamella by identifying second material characteristics of the second lamella associated to each pixel of the third image pixels using at least one of: the first charged particle beam and the second charged particle beam and detecting at least one of: fifth interaction particles and second interaction radiation using the second detection unit;

generating first filtered data for each pixel of the second image pixels using at least one first image filter for processing the second image data for each pixel of the second image pixels, and generating second filtered data for each pixel of the third image pixels using at least one second image filter for processing the third image data for each pixel of the third image pixels;

identifying data identical or similar to the first image data for each pixel of the first image pixels of the first image from among the following: the second image data of each pixel of the second image pixels, the third image data of each pixel of the third image pixels, the first filtered data for each pixel of the second image pixels and the second filtered data for each pixel of the third image pixels; and assigning material characteristics to at least one pixel of the first image pixels of the first image, wherein the first material characteristics are assigned if at least one of: the identified second image data of a pixel of the second image pixels and the identified first filtered data for a pixel of the second image pixels is identical or similar to the first image data of the at least one pixel of the first image pixels and wherein the second material characteristics are assigned if at least one of: the identified third image data of a pixel of the third image pixels and the identified second filtered data for a pixel of the third image pixels is identical or similar to the first image data of the at least one pixel of the first image pixels.

2. The method according to claim 1, further comprising:

generating a third lamella comprising a third side of the opening, the third side and the second side being arranged opposite to each other and the first side being arranged between the second side and the third side;

guiding the second charged particle beam over the third side of the object, detecting sixth interaction particles using the first detection unit, the sixth interaction particles arising when the second charged particle beam impinges on the third side of the object, generating a fourth detection signal using the first detection unit and generating a fourth image of the third side of the object using the fourth detection signal, the fourth image comprising fourth image pixels, each pixel of the fourth image pixels comprising fourth image data;

analyzing the third lamella by identifying third material characteristics of the third lamella associated to each pixel of the fourth image pixels using at least one of: the first charged particle beam and the second charged particle beam, and detecting at least one of: seventh interaction particles and third interaction radiation using the second detection unit;

generating third filtered data for each pixel of the fourth image pixels using at least one third image filter for processing the fourth image data for each pixel of the fourth image pixels;

the step of identifying data identical or similar to the first image data for each pixel of the first image pixels of the first image also comprising identifying from among the following: the fourth image data of each pixel of the fourth image pixels and the third filtered data for each pixel of the fourth image pixels; and the step of assigning material characteristics to at least one pixel of the first image pixels of the first image comprising assigning the third material characteristics if at least one of: the identified fourth image data of a pixel of the fourth image pixels and the identified third filtered data for a pixel of the fourth image pixels is identical or similar to the first image data of the at least one pixel of the first image pixels.

3. The method according to claim 1, wherein the step of identifying identical or similar data comprises comparing the first image data for each pixel of the first image pixels of the first image to at least one of: the second image data of each pixel of the second image pixels, the third image data of each pixel of the third image pixels, the first filtered data for each pixel of the second image pixels and the second filtered data for each pixel of the third image pixels.

4. The method according to claim 1, further comprising at least one of:
(i) analyzing the first lamella using at least one of: X-rays and cathodoluminescence light;
(ii) analyzing the second lamella using at least one of: X-rays and cathodoluminescence light.

5. The method according to claim 1, further comprising at least one of:
(i) analyzing the first lamella using at least one of: EDX, WDX, EBSD and TKD;
(ii) analyzing the second lamella using at least one of: EDX, WDX, EBSD and TKD.

6. The method according to claim 1, wherein the step of identifying identical or similar data comprises using a learning method for classification.

7. The method according to claim 6, wherein the step of identifying identical or similar data comprises using at least one of: a random decision forest, association rule learning, an artificial neural network, a support vector machine and a Bayesian network.

8. The method according to claim 1, further comprising: using at least one of the following filters as the image filter: a Gabor filter, a mean filter, a variance filter, a histogram oriented gradient filter, a maximum filter, a minimum filter and a Kuwahara filter.

9. Computer program product comprising a program code which is loaded into a processor and, which, when being executed, controls a particle beam device to analyze an object by:

guiding a first charged particle beam of the particle beam device over the object, removing material from the object using the first charged particle beam, exposing a first surface of the object when removing the material from the object, guiding a second charged particle beam of the particle beam device over the first surface of the object, detecting first interaction particles using a first detection unit of the particle beam device, the first interaction particles arising when the second charged particle beam impinges on the first surface, generating a first detection signal using the first detection unit and generating a first image of the first surface of the object using the first detection signal, the first image comprising first image pixels, each pixel of the first image pixels comprising first image data;

guiding the first charged particle beam over the object, removing material comprising the first surface from the object using the first charged particle beam, exposing a second surface of the object when removing the material from the object, guiding the second charged particle beam over the second surface of the object, detecting second interaction particles using the first detection unit, the second interaction particles arising when the second charged particle beam impinges on the second surface, generating a second detection signal using the first detection unit and generating a second image of the second surface of the object using the second detection signal, the second image comprising second image pixels, each pixel of the second image pixels comprising second image data, wherein an opening is generated when removing the material from the object so as to expose the first surface and the second surface of the object, wherein the opening comprises a first side comprising the second surface and a second side extending from the second surface of the object in a direction away from the second surface;

generating a first lamella comprising the first side of the opening having the second surface as an outer surface, and generating a second lamella comprising the second side of the opening;

guiding the second charged particle beam over the second side of the object, detecting third interaction particles using the first detection unit, the third interaction particles arising when the second charged particle beam impinges on the second side of the object, generating a third detection signal using the first detection unit and generating a third image of the second side of the object using the third detection signal, the third image comprising third image pixels, each pixel of the third image pixels comprising third image data;

analyzing the first lamella by identifying first material characteristics of the first lamella associated to each pixel of the second image pixels using at least one of: the first charged particle beam and the second charged particle beam, and detecting at least one of: fourth interaction particles and first interaction radiation using a second detection unit;

analyzing the second lamella by identifying second material characteristics of the second lamella associated to each pixel of the third image pixels using at least one of: the first charged particle beam and the second charged particle beam and detecting at least one of: fifth interaction particles and second interaction radiation using the second detection unit;

generating first filtered data for each pixel of the second image pixels using at least one first image filter for processing the second image data for each pixel of the second image pixels, and generating second filtered data for each pixel of the third image pixels using at least one second image filter for processing the third image data for each pixel of the third image pixels;

identifying data identical or similar to the first image data for each pixel of the first image pixels of the first image from among the following: the second image data of each pixel of the second image pixels, the third image data of each pixel of the third image pixels, the first filtered data for each pixel of the second image pixels and the second filtered data for each pixel of the third image pixels; and assigning material characteristics to at least one pixel of the first image pixels of the first image, wherein the first material characteristics are assigned if at least one of: the identified second image data of a pixel of the second image pixels and the identified first filtered data for a pixel of the second image pixels is identical or similar to the first image data of the at least one pixel of the first image pixels and wherein the second material characteristics are assigned if at least one of: the identified third image data of a pixel of the third image pixels and the identified second filtered data for a pixel of the third image pixels is identical or similar to the first image data of the at least one pixel of the first image pixels.

10. Charged particle beam device for analyzing an object, comprising:

a first charged particle beam generator for generating a first charged particle beam having first charged particles;

a first objective lens for focusing the first charged particle beam onto the object;

a second charged particle beam generator for generating a second charged particle beam having second charged particles;

a second objective lens for focusing the second charged particle beam onto the object;

a first detection unit for detecting interaction particles and a second detection unit for detecting at least one of: interaction particles and interaction radiation, the interaction particles and the interaction radiation arising when at least one of the first charged particle beam and the second charged particle beam impinges on the object; and a processor having program code loaded therein which, when being executed, controls the particle beam device to analyze an object by:

guiding the first charged particle beam over the object, removing material from the object using the first charged particle beam, exposing a first surface of the object when removing the material from the object, guiding the second charged particle beam over the first surface of the object, detecting first interaction particles using the first detection unit, the first interaction particles arising when the second charged particle beam impinges on the first surface, generating a first detection signal using the first detection unit and generating a first image of the first surface of the object using the first detection signal, the first image comprising first image pixels, each pixel of the first image pixels comprising first image data;

guiding the first charged particle beam over the object, removing material comprising the first surface from the object using the first charged particle beam, exposing a second surface of the object when removing the material from the object, guiding the second charged particle beam over the second surface of the object, detecting second interaction particles using the first detection unit, the second interaction particles arising when the second charged particle beam impinges on the second surface, generating a second detection signal using the first detection unit and generating a second image of the second surface of the object using the second detection signal, the second image comprising second image pixels, each pixel of the second image pixels comprising second image data, wherein an opening is generated when removing the material from the object so as to expose the first surface and the second surface of the object, wherein the opening comprises a first side comprising the second surface and a second side extending from the second surface of the object in a direction away from the second surface;

generating a first lamella comprising the first side of the opening having the second surface as an outer surface, and generating a second lamella comprising the second side of the opening;

guiding the second charged particle beam over the second side of the object, detecting third interaction particles using the first detection unit, the third interaction particles arising when the second charged particle beam impinges on the second side of the object, generating a third detection signal using the first detection unit and generating a third image of the second side of the object using the third detection signal, the third image comprising third image pixels, each pixel of the third image pixels comprising third image data;

analyzing the first lamella by identifying first material characteristics of the first lamella associated to each pixel of the second image pixels using at least one of: the first charged particle beam and the second charged particle beam, and detecting at least one of: fourth interaction particles and first interaction radiation using the second detection unit;

analyzing the second lamella by identifying second material characteristics of the second lamella associated to each pixel of the third image pixels using at least one of: the first charged particle beam and the second charged particle beam and detecting at least one of: fifth interaction particles and second interaction radiation using the second detection unit;

generating first filtered data for each pixel of the second image pixels using at least one first image filter for processing the second image data for each pixel of the second image pixels, and generating second filtered data for each pixel of the third image pixels using at least one second image filter for processing the third image data for each pixel of the third image pixels;

identifying data identical or similar to the first image data for each pixel of the first image pixels of the first image from among the following: the second image data of each pixel of the second image pixels, the third image data of each pixel of the third image pixels, the first filtered data for each pixel of the second image pixels and the second filtered data for each pixel of the third image pixels; and assigning material characteristics to at least one pixel of the first image pixels of the first image, wherein the first material characteristics are assigned if at least one of: the identified second image data of a pixel of the second image pixels and the identified first filtered data for a pixel of the second image pixels is identical or similar to the first image data of the at least one pixel of the first image pixels and wherein the second material characteristics are assigned if at least one of: the identified third image data of a pixel of the third image pixels and the identified second filtered data for a pixel of the third image pixels is identical or similar to the first image data of the at least one pixel of the first image pixels.

11. The charged particle beam device according to claim 10, further comprising one of the following features:
   a first detector comprises the first detector unit and a second detector comprises the second detector unit; and
   a single detector comprises the first detector unit and the second detector unit.

12. The charged particle beam device according to claim 10, wherein the charged particle beam device is at least one of the following: an electron beam device and an ion beam device.

13. A method for analyzing an object using a charged particle beam device having a charged particle beam generator for generating a charged particle beam having charged particles, an objective lens for focusing the charged particle beam onto the object, a gas injection unit, a first detection unit and a second detection unit, the method comprising:
   guiding the charged particle beam over the object and guiding gas to the object using the gas injection unit, removing material from the object using the charged particle beam and the gas, exposing a first surface of the object when removing the material from the object;
   guiding the charged particle beam over the first surface of the object, detecting first interaction particles using the first detection unit, the first interaction particles arising when the charged particle beam impinges on the first surface, generating a first detection signal using the first detection unit and generating a first image of the first surface of the object using the first detection signal, the first image comprising first image pixels, each pixel of the first image pixels comprising first image data;
   guiding the charged particle beam over the object and guiding the gas to the object using the gas injection unit, removing material comprising the first surface from the object using the charged particle beam and the gas, exposing a second surface of the object when removing the material from the object;
   guiding the charged particle beam over the second surface of the object, detecting second interaction particles using the first detection unit, the second interaction particles arising when the charged particle beam impinges on the second surface, generating a second detection signal using the first detection unit and generating a second image of the second surface of the object using the second detection signal, the second image comprising second image pixels, each pixel of the second image pixels comprising second image data, wherein an opening is generated when removing the material from the object so as to expose the first surface and the second surface of the object, wherein the opening comprises a first side comprising the second surface and a second side extending from the second surface of the object in a direction away from the second surface;
   generating a first lamella comprising the first side of the opening having the second surface as an outer surface, and generating a second lamella comprising the second side of the opening;
   guiding the charged particle beam over the second side of the object, detecting third interaction particles using the first detection unit, the third interaction particles arising when the charged particle beam impinges on the second side of the object, generating a third detection signal using the first detection unit and generating a third image of the second side of the object using the third detection signal, the third image comprising third image pixels, each pixel of the third image pixels comprising third image data;
   analyzing the first lamella by identifying first material characteristics of the first lamella associated to each pixel of the second image pixels using the charged particle beam, and detecting at least one of: fourth interaction particles and first interaction radiation using the second detection unit;
   analyzing the second lamella by identifying second material characteristics of the second lamella associated to each pixel of the third image pixels using the charged particle beam and detecting at least one of: fifth interaction particles and second interaction radiation using the second detection unit;
   generating first filtered data for each pixel of the second image pixels using at least one first image filter for processing the second image data for each pixel of the second image pixels, and generating second filtered data for each pixel of the third image pixels using at least one second image filter for processing the third image data for each pixel of the third image pixels;

identifying data identical or similar to the first image data for each pixel of the first image pixels of the first image from among the following: the second image data of each pixel of the second image pixels, the third image data of each pixel of the third image pixels, the first filtered data for each pixel of the second image pixels and the second filtered data for each pixel of the third image pixels;

assigning material characteristics to at least one pixel of the first image pixels of the first image, wherein the first material characteristics are assigned if at least one of: the identified second image data of a pixel of the second image pixels and the identified first filtered data for each pixel of the second image pixels is identical or similar to the first image data of the at least one pixel of the first image pixels and wherein the second material characteristics are assigned if at least one of: the identified third image data of a pixel of the third image pixels and the identified second filtered data for a pixel of the third image pixels is identical or similar to the first image data of the at least one pixel of the first image pixels.

14. A method for analyzing an object using a charged particle beam device which generates a charged particle beam, comprising:

generating a first data set of a three dimensional measurement volume of an object with a high resolution using the charged particle beam and detecting interaction particles leaving the object due to an impingement of the charged particle beam, the first data set comprising a plurality of individual voxels;

extracting at least one lamella from the object from a region neighbored to the measurement volume by using the charged particle beam device;

generating a second data set of the at least one lamella with a high resolution using the charged particle beam and detecting interaction particles leaving the object due to an impingement of the charged particle beam;

performing charged particle beam analytics using the charged particle beam device at the at least one lamella to identify material characteristics of the at least one lamella;

allocating data of the second data set to the material characteristics; and allocating material characteristics to the individual voxels based on the allocation of the second data set to the material characteristics.

15. The method according to claim 14, further comprising:

extracting two additional lamellas from the object, wherein the additional lamellas are extracted at different sides relative to the three dimensional measurement volume, and performing charged particle analytics at the two additional lamellas.

16. The method according to claim 14, wherein the allocating data of the second data set to the material characteristics comprises:

generating first feature vectors based on the second data set by performing data filtering, and allocating particular feature vectors to particular material characteristics.

17. The method according to claim 16, wherein the allocating material characteristics to the individual voxels based on the allocation of the second data set to the material characteristics comprises:

generating second feature vectors based on the first data set by performing data filtering, and comparing the first feature vectors with the second feature vectors.

* * * * *

UNITED STATES PATENT AND TRADEMARK OFFICE
CERTIFICATE OF CORRECTION

PATENT NO. : 9,905,394 B1
APPLICATION NO. : 15/434132
DATED : February 27, 2018
INVENTOR(S) : Sreenivas Bhattiprolu et al.

Page 1 of 1

It is certified that error appears in the above-identified patent and that said Letters Patent is hereby corrected as shown below:

In the Specification

Column 23, Line 63, please replace "node tin" with --node t in--.

Column 23, please replace the entirety of Line 65 with:

$$G(t) = 1 - \sum_{i=1}^{n} Pi^2 \quad [2]$$

Signed and Sealed this
Twenty-first Day of August, 2018

Andrei Iancu
*Director of the United States Patent and Trademark Office*